(12) United States Patent  
Iwata

(10) Patent No.: US 7,235,913 B2
(45) Date of Patent: Jun. 26, 2007

(54) PIEZOELECTRIC SUBSTRATE, PIEZOELECTRIC RESONATING ELEMENT AND SURFACE-MOUNT PIEZOELECTRIC OSCILLATOR

(75) Inventor: Hirokazu Iwata, Kouza-gun (JP)

(73) Assignee: Toyo Communication Equipment Co., Ltd., Kanagawa (JP)

( * ) Notice: Subject to any disclaimer, the term of this patent is extended or adjusted under 35 U.S.C. 154(b) by 0 days.

(21) Appl. No.: 11/475,815

(22) Filed: Jun. 26, 2006

(65) Prior Publication Data
US 2006/0244346 A1 Nov. 2, 2006

Related U.S. Application Data

(62) Division of application No. 10/691,238, filed on Oct. 22, 2003, now Pat. No. 7,098,574.

(30) Foreign Application Priority Data

Nov. 8, 2002 (JP) .............................. 2002-326066
Feb. 25, 2003 (JP) .............................. 2003-047906

(51) Int. Cl.
 *H01L 41/08* (2006.01)
 *H03H 9/19* (2006.01)
(52) U.S. Cl. ...................... 310/320; 310/368
(58) Field of Classification Search ................ 310/320, 310/321, 367, 368
See application file for complete search history.

(56) References Cited

U.S. PATENT DOCUMENTS 3,694,677 A 9/1972 Guttwein et al.
5,218,328 A 6/1993 Morita et al.
5,235,240 A 8/1993 Morita et al.
5,307,034 A 4/1994 Morita et al.
6,492,759 B1 12/2002 Watanabe
6,750,593 B2 6/2004 Iwata

FOREIGN PATENT DOCUMENTS

JP 2000-40938 2/2000
JP 2002-033640 1/2002

*Primary Examiner*—Thomas M. Dougherty
(74) *Attorney, Agent, or Firm*—Koda & Androlia

(57) ABSTRACT

In the case where an ultraminiature piezoelectric substrate, which has a resonating portion formed by making a concavity by etching in the surface of the piezoelectric substrate made of an anisotropic crystal material, is mass-produced by batch operation using a large-area piezoelectric substrate wafer, an annular portion surrounding each concavity is formed sufficiently thick to prevent cracking from occurring when the wafer is severed. A piezoelectric substrate 2 of an anisotropic piezoelectric crystal material has a thin resonating portion 4 and a thick annular portion 5 integrally surrounding the outer marginal edge of the resonating portion to form a concavity 3 in at least one of major surfaces of the substrate; the inner wall 5a of the annular portion in the one crystal orientation slopes gently more than the inner wall in the other crystal orientation perpendicular to said one crystal orientation, and the piezoelectric substrate is longer in said one crystal orientation than in the other crystal orientation.

5 Claims, 16 Drawing Sheets

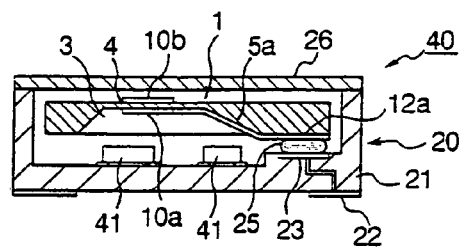
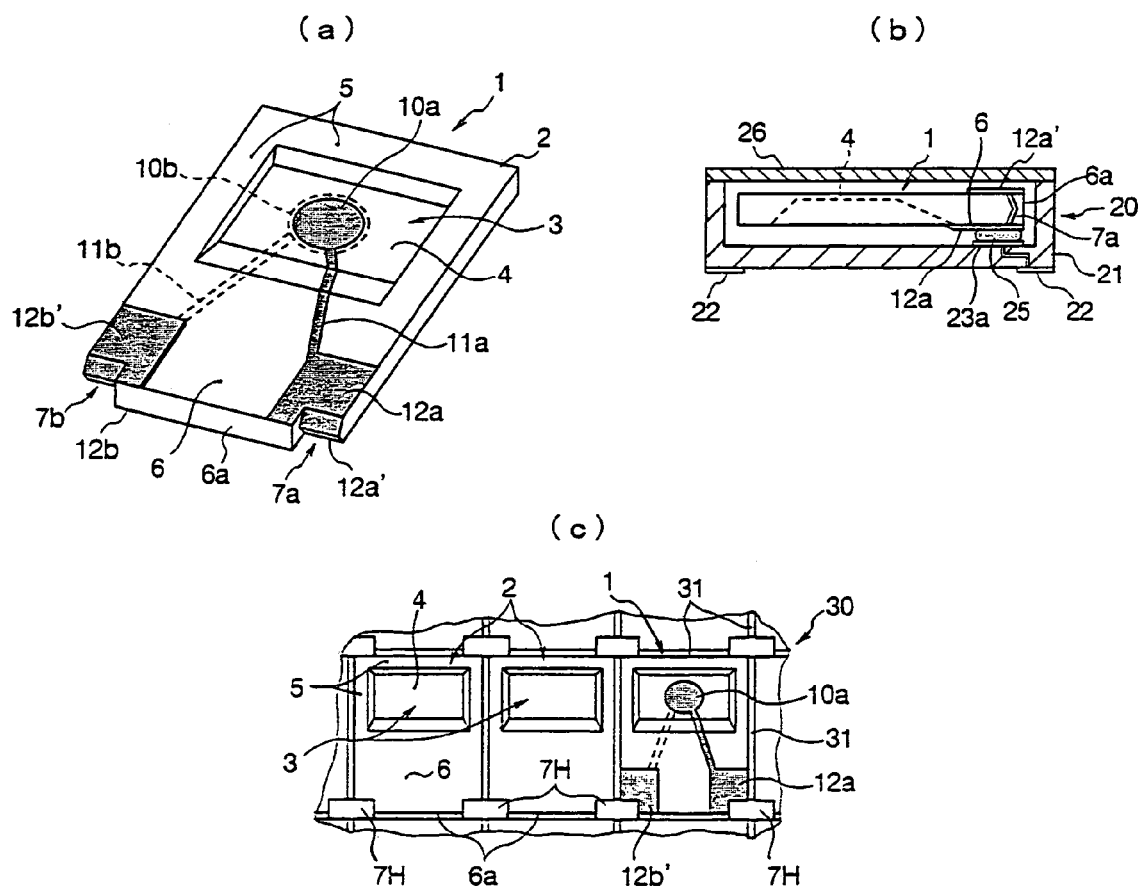

Fig. 5
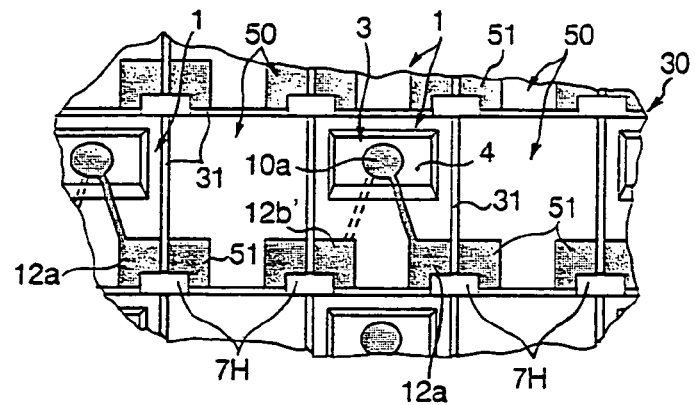
Fig. 6
(a)
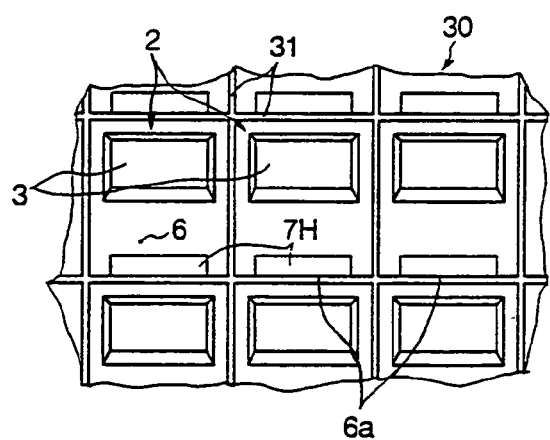
(b)
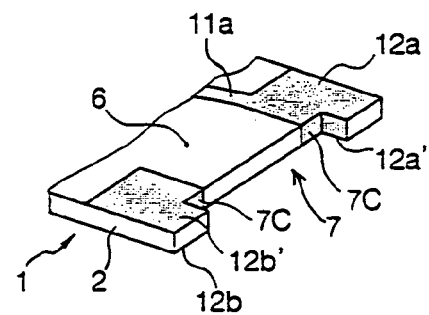

Fig. 9
(a)
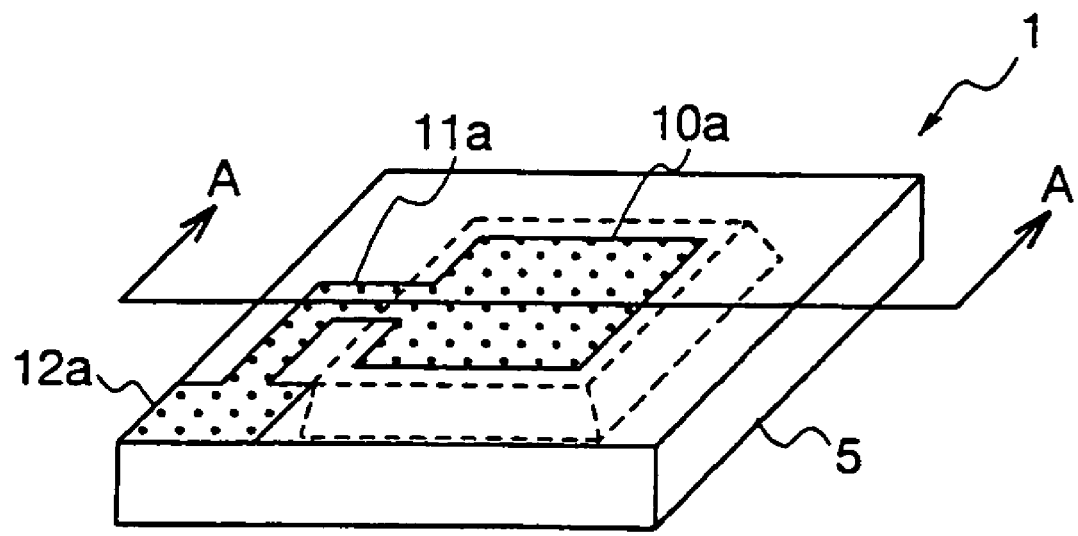
(b)
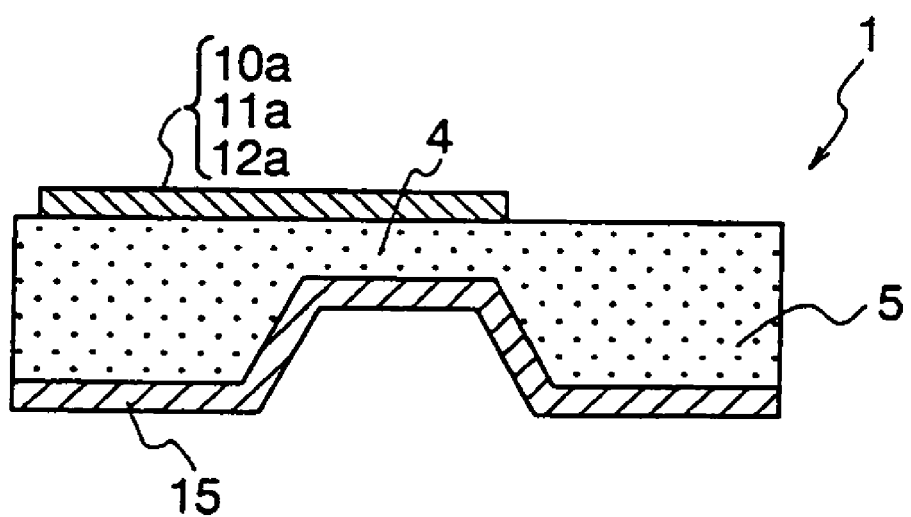

Fig. 11
(a)
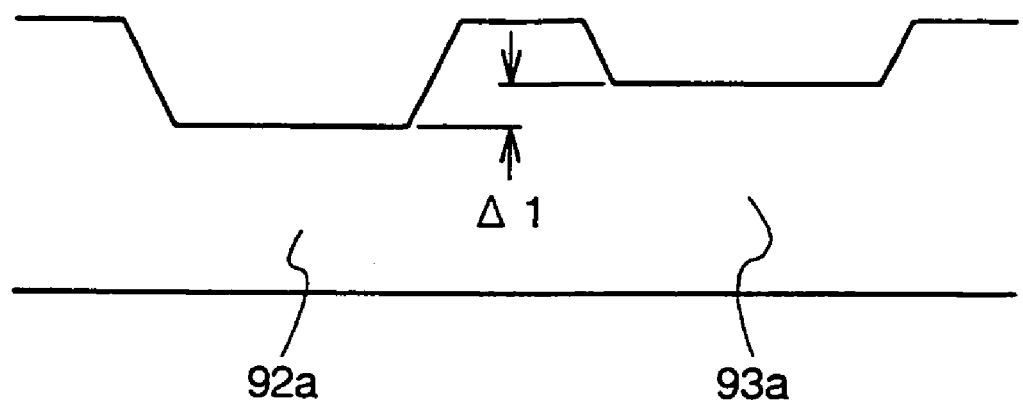
(b)
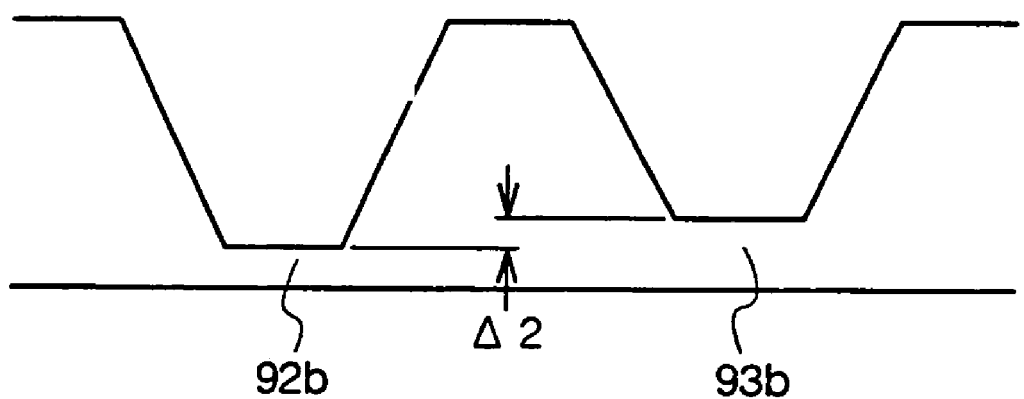

Fig. 13

|  | Etching conditions | | Etching rate [nm/sec] | Adjustment accuracy [nm/sec] |
|---|---|---|---|---|
| First main etching | Etchant | NH$_4$HF$_2$ | 25 | ±612 |
| | Temperature | 85°C | | |
| First fine-adjustment etching | Etchant | 23% Dilute HF | 1.5 | ±93 |
| | Temperature | 21°C | | |
| | Etchant | 12% Dilute HF | 0.75 | |
| | Temperature | 21°C | | |
| Second main etching | Etchant | NH$_4$HF$_2$ | 25 | ±110 |
| | Temperature | 85°C | | |
| Second fine-adjustment etching | Etchant | 23% Dilute HF | 1.5 | |
| | Temperature | 21°C | | |
| | Etchant | 12% Dilute HF | 0.75 | |
| | Temperature | 21°C | | |

Fig. 21
(a)
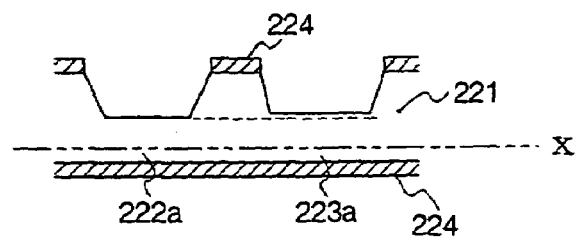
(b)
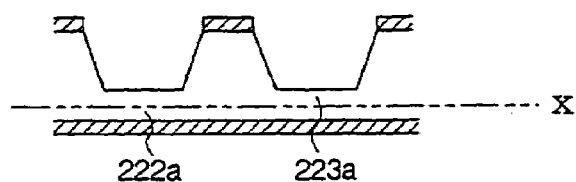
(c)
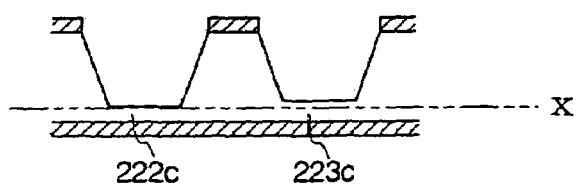
(d)
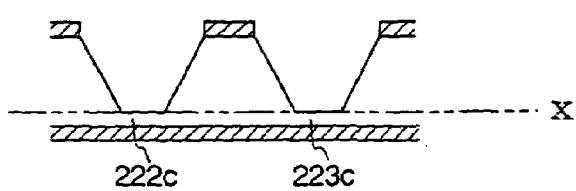

PIEZOELECTRIC SUBSTRATE, PIEZOELECTRIC RESONATING ELEMENT AND SURFACE-MOUNT PIEZOELECTRIC OSCILLATOR

This is a Divisional Application of application Ser. No. 10/691,238, filed Oct. 22, 2003 which is hereby incorporated in its entirety by reference.

BACKGROUND OF THE INVENTION

1. Field of the Invention

The present invention relates to improvements in a piezoelectric substrate of a structure having an ultra-thin resonating portion surrounded with a thick annular marginal portion formed integrally therewith, a piezoelectric resonating element having a conductive pattern including excitation electrodes and so on formed on the piezoelectric substrate, a piezoelectric resonator having the piezoelectric resonating element hermetically sealed in a package, a piezoelectric oscillator using the piezoelectric resonator, and a piezoelectric substrate wafer; more particularly, the invention concerns a technique which in the case of forming the resonating portion profiled with a concavity formed by etching in the surface of a piezoelectric substrate of an anisotropic crystal material, implements the optimum configuration of the resonating portion in conformity to ultraminiaturization of the piezoelectric substrate through utilization of an unetched portion (gentle slopes) on an inner wall of the annular marginal portion, and a technique which increases mass productivity by batch production while maintaining quality. Furthermore, the invention pertains to a method suitable for fine adjustments to the thicknesses of the resonating portions formed by the bottom portions of a plurality of concavities prepared by one operation in a piezoelectric substrate wafer, and a technique for providing the widest possible area for the resonating portion in a limited narrow piezoelectric substrate.

2. Background Art

[First Prior Art Example]

Surface-mount piezoelectric devices of the type having a crystal resonator or similar piezoelectric resonating element hermetically sealed in a package are used as a reference frequency source, a filter and so forth in communication equipment such as a portable telephone and a pager, and in electronic equipment such as a computer; and as these pieces of equipment become miniaturized, there is also growing a demand for miniaturization of the piezoelectric devices.

Furthermore, a piezoelectric oscillator for use as a surface-mount piezoelectric device has a structure in which a piezoelectric resonating element and parts forming an oscillation circuit are housed in a concavity formed in the top surface of the package body as of ceramics material and sealed therein by covering the open top of the concavity with a metal cover.

As the piezoelectric resonating element for use in such a piezoelectric device as mentioned above, there has been known a piezoelectric resonating element composed of: a piezoelectric substrate which has, for high-frequency operations, a thin resonating portion formed by the bottom of a concavity formed by removing part of the substrate surface and surrounded with a thick annular marginal portion integral therewith; input/output electrodes and a grounding electrode formed on top and bottom surfaces of the resonating portion (Pat. Laid-Open Gazette No. 9-055635).

FIGS. 15(a) and (b) are a perspective and a sectional view showing the configuration of an AT-cut crystal resonating element as an example of such a piezoelectric resonating element. The crystal resonating element, denoted generally by 100, is provided with: a crystal substrate 101 formed of an AT-cut crystal as an anisotropic piezoelectric crystal material; excitation electrodes 110 formed on both major surfaces of the crystal substrate; lead electrodes 111 extending from the excitation electrodes 110; and connecting pads 112 forming respective lead electrode terminating ends. The crystal substrate 101 has a construction in which an ultra-thin resonating portion 103 is formed by the bottom of a concavity 102 made by etching in one of two major surfaces of a rectangular, flat-shaped substrate body longer in the x-axis direction and the outer marginal edge of the resonating portion 103 is integrally held by a thick annular portion 104. That one side 104A of the annular marginal portion 104 lying in the x-axis direction is extended a predetermined length in the x-axis direction to form a jut-out portion 105. On one surface of the jut-out portion 105 the lead electrodes 111 are route thereto and the connecting pads 112 are disposed at the ends of the lead electrodes 111.

The reason for making the AT-cut crystal substrate 101 longer in the x-axis direction as mentioned above is that the propagation velocity of waves in the X-axis direction during excitation is approximately 1.2 times higher than the propagation velocity of waves in the x-axis direction; it is customary in the art to adopt such an x-axis long structure which is longer in the x-axis direction.

In the case of using chemical etching to form the concavity 102 in the crystal substrate 101, gentle slopes 104a and 104b of small inclination angles θ are left unetched on inner walls of the annular marginal portions 104 lying in the z-axis direction due to the property of the crystal as an anisotropic crystal material.

FIG. 15(c) is a sectional view showing the state in which the crystal resonating element 100 of the above-described structure is mounted in a surface-mount package 120, wherein the connecting pads 112 of the crystal resonating element 100 with the concavity 102 facing downward are electrically and mechanically fixed by conductive adhesive 122 to pads 121 disposed on the inner bottom of the package 120. The top opening of the package 120 is hermetically sealed with a metal cover 123.

Incidentally, in the case of mass-producing such crystal substrates 101 (or crystal resonating element 100) by batch production through use of a large-area piezoelectric substrate wafer, arrays of individual crystal oscillating elements 100 are laid out as shown in FIG. 16. That is, plural straight dicing grooves (dividing grooves) 131 are cut in a wafer 130 in a grid pattern so that they cross one another at right angles, and rectangular areas defined by the grooves ultimately become individual crystal substrates 101. Through etching of the wafer 130 by use of a predetermined etchant with a mask (a resist film) through which is exposed the crystal substrate surface where the concavity 102 will ultimately be formed, the gentle slopes 104a and 104b are left unetched on the inner walls lying in the z-axis direction corresponding to the crystal orientation in which the etching rate is low, as shown. Thereafter, the excitation electrodes 110, the lead electrodes 111 and the connecting pads 112 are formed in the individual substrate regions as by vapor deposition, after which the wafer is severed along the dicing grooves 131 into individual crystal resonating elements 100.

Incidentally, the crystal substrate to be housed in an ultraminiature package measuring 2.5×2.0 mm needs to be further shrunk to a size of less than 1.3×0.9 mm. On the other hand, in batch production using the wafer 130 it is necessary that the individual crystal substrates be closely spaced to enhance mass productivity by increasing the number of crystal substrates obtainable from each wafer, but in the fabrication of such ultraminiature crystal substrates as mentioned above the spacing w between the dicing groove 131 and each of three marginal edges of the concavity 102 is extremely narrow, making it difficult to provide a sufficiently broad and sufficiently strong annular marginal portion 104. Accordingly, in the case of cutting the wafer along the dicing grooves 131 by means of a dicing blade or similar cutting means, cracking readily occurs in the annular marginal portion 104 and the resonating portion 103, giving rise to a problem of sharp reduction in productivity.

Moreover, since the lead electrodes 111 extending from the excitation electrodes 110 formed on the top and bottom surfaces of the resonating portion 103, respectively, need to be routed along the inner wall of the steeply sloped one side 104A of the annular marginal portion 104 located in the x-axis direction as depicted in FIG. 15(a), the conductive traces are readily broken at sharp marginal edges.

Besides, as shown in FIG. 15(c), the connecting pads 112 are formed on the jut-out portion 105 contiguous to the side 104A with the steeply sloped inner wall and bonded to the pads 121 on the inner bottom of the package by use of the conductive adhesive 122, and consequently, the entire crystal resonating element structure is supported in a cantilever fashion; in this case, however, since the distance between the position where the connecting pads are bonded by the conductive adhesive 122 and the resonating portion 103 is short, stress due to the weight of the crystal resonating element is likely to be applied to the resonating portion 103 to distort it, causing resonance frequency variations.

[Second Prior Art Example]

FIGS. 17(a) and (b) are a sectional view of another conventional surface-mount crystal resonator and a sectional view taken on the line A—A, the resonator having a configuration in which the package 120 having housed therein the crystal resonating element 100 held in a cantilever fashion is hermetically sealed with the metal cover 123. On both sides of the jut-out portion 105 of the crystal substrate 101 there are formed two connecting pads 112a and 112b, respectively. In this instance, the connecting pad 112a facing toward the inner bottom of the package can easily be connected electrically and mechanically to the pad 121a opposite thereto by the conductive adhesive 122, but the connection of the other connecting pad 112b to the corresponding pad 121b in the package requires double coating of the adhesive since the former is formed on the flat surface of the crystal substrate. The double coating of the adhesive involves first coating of the adhesive between the pad 121b and the underside of the crystal substrate and second coating of the adhesive to interconnect the upper connecting pad 112b and the adhesive coated first.

When coated twice, however, the adhesive 122 partly protrudes upward of the connecting pad 112b, and to prevent it from contacting the underside of the metal cover 123, it is necessary to increase the height of the outer peripheral wall of the package 120. This constitutes an obstacle to a reduction in profile of the package and ignores the demand for miniaturization.

As a solution to this problem, it is conventional to employ such a structure as shown in FIG. 17(c), in which a concave notch 140 (140a, 140b) deposited over the entire area of its inner wall with a conductive film is formed in the edge face of the substrate adjacent the marginal edge of the upper connecting pad 112b to establish electrical connections between the conductive film on the inner wall of the concave notch 140b and the connecting pad 112b on the top of the substrate, whereas on the underside of the substrate there is formed a connecting pad 112b' for electrical connection with the conductive film on the inner wall of the concave notch 140b. With this structure, the lower connecting pad 112b' and the pad 121b on the inner bottom of the package are connected via the conductive adhesive 122, establishing electrical connections between the upper connecting pad 112b and the pad 121b by single coating of the adhesive.

Such a concave notch as mentioned above is formed using the procedure as shown in FIG. 17(d): making small rectangular holes in each crystal substrate 101 from both of its top and underside surfaces by chemical etching using a mask (resist film) for the large-area piezoelectric substrate wafer 130; interconnecting the both small rectangular holes to form a through hole 140H; depositing the conductive film all over the inner wall of the through hole; and severing the wafer along the dicing grooves 131 into individual crystal substrates. However, the diameter (width) of each through hole 140H to be formed within the width of the connecting pad 112b on the ultraminiature crystal resonating element measuring, for instance, less than 1.3×0.9 mm inevitably becomes as small as on the order of μ—this causes frequent occurrence of insufficient etching that does not completely interconnect the small rectangular holes made in each crystal substrate from its top and underside surfaces. On the other hand, since the through hole 140H forming the concave notch 140 is formed in a narrow area of the connecting pad 112b of a limited area, the diameter of the hole is also limited accordingly. It is particularly difficult to form two through holes in one marginal edge face of each piezoelectric substrate of an extremely small area.

Accordingly, there has been a strong demand for solving the problem of low yields of ultraminiature crystal resonating elements caused by insufficient chemical etching of the large-area piezoelectric substrate wafer 130 to form therein the through holes 140H which are ultimately used as the concave notches 140.

Incidentally, the reason for providing the pair of concave notches 140 in the edge face of each crystal substrate 101 is that the one concave notch 140b is to establish electrical connections between the upper connecting pad 112b and the pad 121b on the package as referred o above, whereas the other concave notch 140a is to provide on the top surface of the crystal substrate the upper connecting pad 112a' electrically connected to the lower connecting pad 112a. With such an arrangement, measurement of characteristics of each individual crystal resonating element formed on the wafer 130 can be done with probe pins of a measuring instrument held from the same direction against the two connecting pads 112b and 112a' on the top of the crystal substrate or the two connecting pads 112a and 112b' on the underside of the substrate. The reason for this is that it is most efficient to conduct the measurement with the probe pins held against the two connecting pads on the same surface of the substrate.

Besides, the crystal resonating element 100 is not always mounted in the package with the concavity oriented downward as shown in FIG. 17(a), but it may also be held upward. Hence, the provision of the two connecting pads on either side of the substrate enables one crystal resonating element 100 to be mounted in the package in an arbitrary orientation.

[Third Prior Art Example]

In the formation of concavities by chemical etching in individual piezoelectric substrate regions on a sheet-like piezoelectric substrate wafer with a plurality of piezoelectric substrates arranged in a matrix form, it is difficult to make uniform the thicknesses of all ultrathin resonating portions formed by concavity bottom portions. To obviate this problem, it is customary in the prior art to premeasure the depth of each concavity, that is, variations in the thicknesses of the resonating portions in the respective concavities, and to conduct an adjustment operation using an etchant for each concavity to make fine adjustment to the thickness of the resonating portion having not reached a predetermined value.

FIGS. 18(a) and 18(b) are diagrams for explaining a conventional fine adjustment method for each concavity, according to which the concavities 102 are formed by simultaneously etching only those wafer surface areas exposed through apertures of a mask (resist film) covering the one major surface of the piezoelectric substrate wafer 130, though not shown. Since such one operation by etching does not make uniform the thicknesses of the resonating portions 103 formed by the bottom portions of the concavities 102, the thicknesses of the resonating portions 103 of the concavities 102 are premeasured, and then etching is carried out for each concavity after a guide mask with apertures arranged in a grid pattern, such as denoted by reference numeral 150, is mounted on the wafer 130 and held in close contact with the wafer surface areas between adjacent concavities. That is, the guide mask 150 has a plurality of apertures 152 of a rectangular or some other shape formed through a sheet of resin, for instance, with a predetermined pitch; the apertures 152 of the shape matching the plan configuration of the concavities 150 are defined by adjacent partitioning parts 151 intersecting in a grid pattern. The guide mask 150 is fixed to the wafer 130 all over it with the partitioning parts 151 held in close contact with the wafer surfaces around the concavities 102 as shown in FIG. 18(b). Then, the concavities are sequentially filled with proper amounts of etchant 155 for different periods of time precalculated therefor in decreasing order of thickness of the resonating portion. At a point in time all the resonating portions have been etched to a predetermined thickness, the entire wafer assembly is cleaned up to remove therefrom the etchant.

Incidentally, miniaturization of the apertures 152 of the guide mask 150 is limited due to limitations imposed on machining techniques; and an achievable minimum size is such as depicted in FIG. 18(b). Accordingly, in order to make fine adjustments to the thicknesses of the resonating portions of miniature concavities 102 in the wafer 130 having more miniature piezoelectric substrates by individual etching as shown in FIG. 18(c), there is no choice but to use the guide mask 150 prepared for large concavities. Alternatively, to permit accurate dropwise filling of the concavities with the etchant, the apertures 152 need to be of such a size as shown in FIG. 18(b) at minimum. When such a guide mask is used, the concavities 102 and the dicing grooves 131 are exposed through the apertures 152 defined by adjacent partitioning parts 151, as depicted in FIG. 18(b). In this instance, when each aperture 152 is filled with the etchant, excess etchant overflowing the concavity penetrates into the dicing grooves 131 and unnecessarily etches away those regions undesired to etch, incurring a decrease in the mechanical strength of the regions concerned. Moreover, there is a fear that the surface tension of the etchant 155 filling the concavity 102 prevents it from making full contact with the entire area of the bottom of the concavity, leaving therein unetched portions 156 as shown in FIG. 18(d), and hence resulting in the individual etching becoming unsuccessful.

As described above, in the case of individual etching of the concavities to remove variations in the depths of the concavities formed by batch operation in the wafer, the limitations on the size of the apertures of the guide mask 150 incur the possibility of unnecessary etching or poor etching of the resonating portion.

[Fourth Prior Art Example]

FIG. 19 is a sectional view showing the configuration of an AT-cut crystal substrate as an example of the piezoelectric substrate. The crystal substrate 101 is made of an AT-cut crystal as an anisotropic piezoelectric crystal material, and the crystal substrate 101 has formed in both major surfaces thereof concavities 102a and 102b that are symmetrical about a point to each other. That is, the crystal substrate 101 has the concavities 102a and 102b formed therein by etching a rectangular flat-shaped substrate body through masks (resist) 160 covering its both major surfaces in such a manner that the bottom panel common to the concavities 102a and 102b form an ultrathin resonating portion 103 integrally with the thick marginal portion 104. Due to a difference in etching rate between the z- and x-axis directions, the inner walls 104a and 104b of two sides of the annular marginal portion 104 lying in the z-axis direction slope more gently than the other inner walls lying in the x-axis direction. In addition, the both inner walls 104a and 104b differ in inclination angle.

In etching, however, when the masks 160 having the apertures of the same shape are mounted on both sides of the crystal substrate 101 in alignment with each other, the z-axis side inner walls 104a and 104b of the concavities 102a and 102b bear such symmetric positional relationship as shown, in consequent of which edges 102' and 102b' of the bottom surfaces of the respective concavities 102a and 102b are not in aligned relation. Since the edges 102a' and 102b' of the bottom surfaces of the concavities 102a and 102b are thus displaced in the z-axis direction relative to each other, the bottom surfaces of the two concavities are not directly opposite, decreasing the area of each resonating portion 103 and consequently the effective thin region (the effective vibrating region). This raises a problem of deteriorated characteristics of the crystal resonating elements with electrodes and so forth formed on such crystal substrates. In particular, further miniaturization of the piezoelectric substrate will increase the severity of such a glitch.

[Fifth Prior Art Example]

A description will be given of, with reference to FIGS. 20 and 21, of a conventional method for manufacturing the crystal resonating element with an ultrathin resonating portion. This is the manufacturing method that the inventor of present invention disclosed in Technical Report of the Institute of Electronics, Information and Communication Engineers of Japan, "UHF-Band Crystal Resonator Using Fundamental Wave," (Technical Report of IEICE US98-27, EMD98-19, CPM98-51, OME98-49 (1998-07), Corporation-Institute of Electronics, Information and Communication Engineers of Japan).

FIG. 20 is a flowchart of a crystal resonator manufacturing process, and FIGS. 21(a) to (d) are longitudinal-sectional views showing the crystal resonator in an etching process, the chain double-dashed lines X in FIGS. 21(a) to (d) being imaginary lines indicating the thickness of the resonating portion at the end of four stages of the chemical etching process.

In a crystal resonator for fundamental wave vibration in the UHF or higher band, for instance, since the amount of change in frequency with respect to the amount of change in wafer thickness is large, the thickness of the crystal wafer is adjusted by four-stage chemical etching steps 203 through 206 to obtain the resonating portion 103 that is excitable at the desired fundamental-wave resonance frequency.

The manufacturing process begins with polishing the major surface of the crystal wafer (step 200), followed by vacuum depositing a gold/chromium film on the polished major surface (step 201). In view of a tradeoff between the mechanical strength of the wafer and the amount of etching, let it be assumed that the crystal wafer is 80 micrometers (μm) thick. The gold/chromium film is selectively removed by photolithography to form a mask pattern for etching (step 202).

Thereafter, first main etching (step 203) through second fine-adjustment etching (step 206) processes are performed as described below. In the first main etching process (step 203), as depicted in FIG. 21(a), a crystal wafer 221 with a mask pattern for etching 224 formed thereon is subjected to wet etching to etch away the regions of the wafer underlying apertures of the mask pattern to form concavities as resonating portions 222a and 223a that resonate in the VHF band, for example, at 155 MHz. In practice, however, since the thicknesses of the resonating portions 222a and 223a differ due to wafer etching errors or the like, the resonance frequencies of the resonating portions 222a and 223a are measured.

And, in the first fine-adjustment etching process (step 204) shown in FIG. 21(b), an etchant is added dropwise to the respective concavities for different periods of time based on the measured resonance frequencies, by the technique disclosed, for example, in Pat. Laid-Open Gazette No. 6-021740, by which the thicknesses of the resonating portions 222a and 223a are individually adjusted so that their resonance frequencies become as desired. Moreover, as depicted in FIG. 21(c), in second main etching process (step 205) the wafer is further subjected to wet etching to form resonating portions 222c and 223c each having a thickness of about 2.2 μm that corresponds to a resonance frequency in the desired UHF band, for instance, at 760.9 MHz. Then the resonance frequencies of the resonating portions are measured again, and in second fine-adjustment etching shown in FIG. 21(d) dry etching is carried out for each of the resonating portions 222c and 223c based on their measured frequencies so that they resonate at desired frequencies. After this, gold/chromium is vacuum deposited all over both major surfaces of the wafer (step 207), then electrode patterns are formed thereon (step 208), and the wafer is severed into the crystal resonating elements 100 (step 209). The crystal resonating elements 100 are each mounted in a package, then connected thereto by bonding or bumps (step 210), and sealed therein after being subjected to final frequency adjustment (step 211, 212).

The second fine-adjustment etching process (step 206) 114 is performed by dry etching of low etching rate for high-precision individual adjustment to obtain the thickness of approximately 2.2 μm which corresponds to the desired resonance frequency of 760.9 MHz.

FIG. 22 is a longitudinal section view showing the working of the resonating portion; when the afore-mentioned four-stage (step 203 through step 206) chemical etching for forming a resonating portion 232d from only one direction (indicated by the arrow), that is, from the direction of the opening of the concavity, the area of the resonating portion 232a on the side of the opening of the concavity gradually decreases and the area of the resonating portion 232d becomes extremely small due to the dependence of the etching rate on the crystal orientation, and consequently, a vibrating region 232h of the resonating portion 232d becomes extremely narrow than a desired value. For example, in the case of obtaining a resonator whose fundamental frequency is 760.9 MHz, the thickness of the resonating portion is about 2.2 μm, and if the thickness of the crystal wafer is set at 80 μm from the viewpoint of its mechanical strength, then it is etched to a depth of around 77.8 μm to form a concavity. Then, even if the opening of the concavity is 0.7×0.55 millimeters (mm), the area of the vibrating region 222h is approximately 0.25×0.15 mm that is smaller than the desired area. For example, when the oscillation frequency is 622.3 MHz, the desired size of the vibrating region 222h is required to be in the range of 0.5 ; to 0.75×0.3 to 0.45 mm that is twice to three times (taking into account variations caused during manufacturing process) larger than the size of the electrode to be formed in the vibrating region 232h (an ellipse of a size measuring a longer diameter 0.25× a shorter diameter 0.15 mm).

Furthermore, the slope between the top surface of the annular marginal portion 232b and the vibrating region 232h becomes so wide that a lead (not shown) formed on the slope becomes long, giving rise to a problem that the resistance or parasitic impedance of the lead increases.

In the second main etching process (step 205) the etchant used is a low-temperature ammonium hydrogen fluoride saturated solution, which prevents overetching but is low in working efficiency because of low etching rate; since the second fine-adjustment etching (step 206) is performed by dry etching of low etching rate for implementing high-precision adjustment, there is a problem of etching damage by crystal defects, contamination with an impurity, or the like.

Furthermore, supply control (flow rate and pressure) of an etching gas for dry etching has so high a correlation with uniformity of etching that the number of etching gas supply holes and their size must be changed for each operation; hence, it is difficult to obtain the optimum conditions for etching.

Besides, since the etching process shown in FIG. 20 is followed by the gold/chromium vapor deposition step 207 for vapor depositing the conductive film that will ultimately form a main electrode film 110 and then by the final frequency adjustment process (step 211) for making high-precision frequency adjustments by vapor deposition or sputtering, the thickness adjustment by the etching process needs only to make adjustments to such an extent as to allow compensation in the final frequency adjustment process (step 211), and hence the etching scheme in this process is more than required.

Furthermore, the combined use of wet etching and dry etching inevitably leads to complication of the manufacturing process and an increase in capital investment, constituting an obstacle to bringing down costs of UHF-band crystal resonators.

SUMMARY OF THE INVENTION

The present invention is intended to solve the above-mentioned problems of the prior art; a first object of the invention, which copes with the problem of the first prior art example, lies in that in the case where ultraminiature piezoelectric substrates each having a resonating portion formed by a concavity made by etching in the surface of an anisotropic piezoelectric crystal material are mass-produced by batch production using a large-area piezoelectric substrate wafer, the annular marginal portion surrounding the concavity is formed sufficiently thick to prevent individual piezoelectric substrates from cracking when the wafer is severed thereinto. Another subject is to prevent a break in a conductive trace by routing it along the inner wall of the annular marginal portion, not on the steep slope formed thereon by a portion left unetched. Still another subject lies in that in the case where a piezoelectric resonating element is supported in a cantilever fashion in a package, the resonating portion is spaced as far apart from the cantilever supporting portion as possible to prevent stress by the weight of the crystal resonating element from being applied to the resonating portion. Thus, the first subject is to implement the optimum ultraminiature configuration of the piezoelectric substrate provided with an ultrathin resonating portion and a thick annular marginal portion surrounding it.

A second object of the invention, which copes with the problem of the second prior art example, lies in that the through holes (concave notches), which are made by chemical etching as electrical connecting means for forming two connecting pads on either surface of each substrate blank of a piezoelectric substrate wafer having piezoelectric substrates blanks arranged in sheet form, are prevented from inadequate formation due to limitations on the size of openings of the through holes and reduction in productivity resulting from such inadequate formation of the through holes is also prevented.

A third object of the invention, which copes with the problem of the third prior art example, lies in that to obviate various glitches which are caused when the thicknesses of resonating portions of individual concavities are each adjusted by etching for a different period of time after the concavities are formed by batch production in the piezoelectric substrate wafer, fine adjustments to the resonating portions by etching the wafer from the side of its flat surface instead of filling each concavity with the etchant.

A fourth object of the invention, which copes with the problem of the fourth prior art example, is to obviate the problem that in the piezoelectric substrate having a thin resonating portion formed by making concavities by chemical etching in both major surfaces of the substrate made of an anisotropic crystal material, the effective area of the resonating portion is made small by a displacement of the opposed concavities relative to each other in the one crystal orientation.

A fifth object of the invention, which copes with the problem of the fifth prior art example, is to provide a method for the manufacture of a high-efficiency but low-cost piezoelectric resonating element and, in particular, a method for the manufacture of a UHF-band AT-cut crystal resonator.

To attain the above objective, the piezoelectric substrate recited in claim 1 is a piezoelectric substrate made of an anisotropic piezoelectric crystal material and provided with a thin resonating portion and a thick annular portion integrally surrounding the outer marginal edge of said resonating portion, and a concavity formed in at least one of major surfaces of said piezoelectric substrate; the piezoelectric substrate is characterized in that the inner wall of said annular portion in the one crystal orientation slopes at an angle less than that of the inner wall in the other crystal orientation perpendicular to said one crystal orientation, and that said piezoelectric substrate is longer in said one crystal orientation than in said other crystal orientation.

In the case of a flat-shaped piezoelectric substrate made of an anisotropic piezoelectric material along two crystal axes crossing at right angles, when a concavity is formed by chemical etching in the piezoelectric substrate surface, since the etching rate is higher in the one crystal orientation than in the other crystal orientation, the inner wall of an annular portion surrounding the concavity in said other crystal orientation slopes gently (that is, forms a gentle slope). In the present invention, since one side of the annular portion having such a gently sloping inner wall is extended to form a jut-out portion, dicing grooves or the like defining each piezoelectric substrate and the concavities can be spaced sufficiently far apart in the mass production of piezoelectric substrates (piezoelectric resonating elements) by batch production using a large-area piezoelectric substrate wafer, and consequently, the annular portion can be formed thick. Accordingly, no cracking occurs in the annular portion when the wafer is severed along the dicing grooves. This implements optimum ultraminiaturization of the configuration of the piezoelectric substrate having an ultrathin resonating portion and a thick annular portion surrounding it.

The piezoelectric substrate recited in claim 2 is made of an AT-cut crystal and provided with a thin resonating portion, a thick annular portion integrally surrounding the outer marginal edge of said resonating portion, and a concavity formed in at least one of major surfaces of said piezoelectric substrate; the piezoelectric substrate is characterized in that the piezoelectric substrate made of the AT-cut crystal is longer in a z'-axis direction than in an x-axis direction.

When the above-mentioned piezoelectric substrate is an AT-cut crystal substrate, the substrate may preferably be made longer in the z-axis direction than in the x-axis direction.

The piezoelectric resonating element recited in claim 3 is provided with excitation electrodes formed opposite on both sides of said resonating portion of the piezoelectric substrate of claim 1 or 2, a lead electrode extending from each of said excitation electrodes to one marginal edge of the piezoelectric substrate lengthwise thereof and a connecting pad connected to the lead electrode; the piezoelectric resonating element is characterized in that the lead electrode extending from the excitation electrode on the side of the concavity is routed out via said gently sloped inner wall of the annular portion.

With such a structure, it is possible to prevent a break in the lead electrode (a conductor trace) by bypassing a steep slope formed by an unetched portion on the inner wall of the annular portion.

The piezoelectric resonator recited in claim 4 is characterized in that the piezoelectric substrate forming the piezoelectric resonating element of claim 3 is held at one end in its lengthwise direction in a cantilever fashion in a surface-mount package.

With such a structure, when the piezoelectric resonating element is held in a cantilever fashion in the package, it is possible to prevent stress caused by the weight of the crystal resonating element from being applied to the resonating portion by maximizing the distance from the cantilever holding portion to the resonating portion.

The surface-mount piezoelectric oscillator recited in claim 5 is characterized by the provision of at least the piezoelectric resonator of claim 4 and an oscillation circuit.

The piezoelectric substrate recited in claim 6 is provided with a thin resonating portion, a thick annular portion integrally surrounding the outer marginal edge of said resonating portion, a concavity formed in at least one of major surfaces of said piezoelectric substrate, and a jut-out portion formed by extending one side of said annular potion; the piezoelectric substrate is characterized in that said jut-out portion has formed in its forward marginal edge at least one concave notch open into either surface of said piezoelectric substrate.

In the case where connecting pads connected to two excitation electrodes are formed on either surface of the jut-out portion of the piezoelectric substrate, they can be connected to pads on the bottom of the package by single coating of a conductive adhesive-this eliminates the need for using a package with a large outer peripheral wall. On the other hand, in the case where two connecting pads on either surface of said jut-out portion, either surface of the piezoelectric substrate can be held up or down as desired when it is mounted in the package; hence, the two connecting pads disposed on both surfaces need to be interconnected via two concave notches in the forward marginal edge of the jut-out portion. In this case, if the two concave notches are arranged in the width of the forward marginal edge of the jut-out portion as in the past, the width of each concave notch becomes extremely small, increasing the possibility that the concave notches (through holes) open to either surface of the substrate cannot be formed by etching the piezoelectric substrate wafer. In view of this, according to the present invention, elongated through holes lying astride adjacent substrates are formed through the wafer to eliminate the possibility of insufficient formation of the concave notches by poor etching.

The piezoelectric substrate recited in claim 7 is characterized in that said concave notches are each formed at one of two corners of the forward marginal edge of said jut-out portion in claim 6.

It is effective to form said through holes at both corners of the forward marginal edge of the jut-out portion of each piezoelectric substrate of the piezoelectric substrate wafer so that the through holes lie astride adjacent substrate regions.

The piezoelectric resonating element recited in claim 8 is provided with excitation electrodes formed opposite on both surfaces of said resonating portion of the piezoelectric substrate of claim 6 or 7 and lead electrodes extending from the respective excitation electrodes to the forward marginal edge of said hut-out portion; the piezoelectric resonating element is characterized in that the lead electrode on either one of the substrate surfaces is routed through said concave notch to the other substrate surface and connected to the connecting pad formed thereon.

It is possible to form two connecting pads side by side on the same surface of the jut-out portion, or two connecting pads side by side on either surface of the jut-out portion.

The piezoelectric resonator recited in clam 9 is characterized in that the two connecting pads formed side by side on the same surface of the jut-out portion of the piezoelectric substrate forming the piezoelectric resonating element of claim 8 are fixedly connected by a conductive adhesive to pads in the surface-mount package, respectively.

The surface-mount piezoelectric oscillator recited in claim 10 is characterized by the provision of at least the piezoelectric resonator of claim 9 and an oscillation circuit.

The piezoelectric substrate wafer recited in claim 11 is a piezoelectric substrate wafer having the piezoelectric substrates of claims 6 to 8 arranged in sheet form, which is characterized in that said concave notches are formed by through holes simultaneously made in the wafer astride adjacent piezoelectric substrates.

It is possible to make the through holes large which are formed astride adjacent substrate regions of the wafer. Accordingly, in the case of forming small concave notches by simultaneously etching both surfaces of the piezoelectric substrate, the both small concave notches can be made to communicate with each other to form the through holes. Alternatively, the number of concave notches in the edge face of one piezoelectric substrate needs not to be two, but instead one elongated hole may also suffice which is made in the forward marginal edge of the jut-out portion. In this instance, the elongate through hole needs only to be made within a certain width in the forward marginal edge of the jut-out portion of the piezoelectric substrate of the wafer.

The piezoelectric substrate wafer recited in claim 12 is a piezoelectric substrate wafer having the piezoelectric substrates of claims 6 or 7 arranged in sheet form, which is characterized in that said concave notches are formed by through holes made astride unused regions of adjacent substrates.

With the piezoelectric substrates arranged directly in side-by-side relation, in the case of measuring characteristics of each piezoelectric resonating element with a probe pin held in contact with each of connecting pad after forming the excitation electrodes, the lead electrodes and the connecting pads, the contact pressure of the probe pin causes a change in the resonance frequency of the resonating element, making accurate measurement impossible. To avoid this, unused regions (dummy regions) are provided between adjacent piezoelectric substrates and the connecting pads are each formed astride the adjoining unused regions. When conducting measurement with the probe pin held in contact with the connecting pad on the unused region, no bad influence is exerted on measured values by the contact pressure of the probe pin. In particular, the formation of dicing grooves in the substrate surface between the piezoelectric substrates and the unused regions further lessens bad influence of the contact pressure.

The piezoelectric substrate recited in claim 13 is provided with a thin resonating portion, a thick annular portion integrally surrounding the outer marginal edge of said resonating portion and a concavity formed in at least one of major surfaces of the substrate; the piezoelectric substrate is characterized in that a thickness fine-adjustment portion for the resonating portion is provided on the substrate surface on the opposite side from said concavity.

Conventionally, plural concavities are formed by etching in one of major surfaces of a piezoelectric wafer at predetermined intervals, after which an etchant is filled into each concavity through a guide mask mounted on the substrate surface so as to make fine-adjustment to the thickness of the resonating portion in the concavity; but when the concavity becomes ultraminiaturized, the etchant permeates to other regions through the dicing grooves cut between the substrate regions and etches portions which need not be etched, causing glitches such as reduction in the mechanical strength of the substrate.

According to the present invention, the fine adjustment to the thickness of the resonating portion is made by filling an opening of the guide mask mounted on the side of the flat surface of the wafer with the etchant-this obviates the defects of the prior art and ensures adjustment to the thickness of the resonating portion of the piezoelectric substrate having an ultraminiaturized concavity.

The piezoelectric resonating element recited in claim 14 is characterized by the provision of the excitation electrodes formed opposite on both sides of said resonating portion of the piezoelectric substrate of claim 13, lead electrodes each extending from one of the excitation electrodes to one end edge of the piezoelectric substrate lengthwise thereof, and connecting pads each connected to one of the lead electrodes.

The piezoelectric resonator recited in claim 15 is characterized in that the piezoelectric substrate forming the piezoelectric resonating element of claim 14 is fixedly held at one end to the inside of a surface-mount package in a cantilever fashion.

The piezoelectric oscillator recited in claim 16 is characterized by the provision of at least the piezoelectric resonator of claim 15, and an oscillation circuit.

The piezoelectric substrate wafer recited in claim 17 is characterized in that a plurality of such piezoelectric substrates of claim 13 are arranged in a sheet form.

The piezoelectric substrate wafer recited in claim 18 is characterized in that adjacent piezoelectric substrates of said piezoelectric substrate wafer are separated by a dead space through two parallel dicing grooves therebetween in claim 17.

With a dummy region as the dead space interposed between adjacent piezoelectric substrates, it is possible to avert the bad influence by the etchant during the thickness adjustment conducted from the side of the flat wafer surface.

The piezoelectric substrate wafer manufacturing method recited in claim 19 is characterized in that the resonating portion thickness fine-adjustment portion, formed on the piezoelectric substrate wafer of claim 17 or 18 in the wafer surface opposite from the concavity of each piezoelectric substrate, is formed by mounting a guide mask, which has a plurality of openings each larger than the concavity and arranged in a grid pattern, on the piezoelectric substrate wafer on said opposite surface and then filling an etchant into each opening of said guide mask.

The piezoelectric substrate recited in claim 20 is made of an anisotropic piezoelectric crystal material and provided with a thin resonating portion, a thick annular portion integrally surrounding the outer marginal edge of said resonating portion and concavities formed on both major surfaces of the piezoelectric substrate; the piezoelectric substrate is characterized in that said concavities are each configured so that the inner wall of the annular portion in the one crystal orientation has a smaller inclination angle than does the inner wall of the annular portion in the other crystal orientation crossing said one orientation at right angles thereto and that those marginal edges of the inner bottoms of said concavities lying in the same crystal orientation are aligned with each other.

In the case of forming the concavities in the piezoelectric substrate of an anisotropic piezoelectric crystal material by etching from its both surfaces through masks of the same configuration, if respective openings of the both masks are aligned with each other, the both concavities each have point symmetry and marginal edges of the inner bottoms of the both concavities (in particular, the marginal edges in crystal orientation in which the etching rate is low) are not aligned with each other. On this account, the area of the thin resonating portion becomes small.

According to the present invention, the marginal edges of the openings of the both masks (in particular, the marginal edges in the crystal orientation in which the etching rate is low) are predisplaced as predetermined to bring the marginal edges of the both concavities into alignment with each other after etching. This permits maximization of the area of the resonating portion, making it possible to obtain highly reliable piezoelectric substrates, piezoelectric resonators and so on.

The piezoelectric substrate recited in claim 21 is characterized in that it is made of an AT-cut crystal in claim 20.

The piezoelectric resonating element recited in claim 22 is characterized by the provision of excitation electrodes formed opposite on both surface of said resonating portion of the piezoelectric substrate of claim 20 or 21, lead electrodes each extending from one of the excitation electrodes to one marginal edge of the piezoelectric substrate in its lengthwise direction, and connecting pads connected to the lead electrodes, respectively.

The piezoelectric resonator recited in claim 23 is characterized in that the piezoelectric substrate forming the piezoelectric resonating element of claim 22 is fixed held at one end to the inside of a surface-mount package in a cantilever fashion.

The surface-mount piezoelectric oscillator recited in claim 24 is characterized by the provision of at least the piezoelectric resonator of claim 23 and an oscillation circuit.

The piezoelectric substrate manufacturing method recited in claim 25 is a method for the manufacture of a piezoelectric substrate made of an anisotropic piezoelectric crystal material and provided with a thin resonating portion, a thick annular portion integrally surrounding the outer marginal edge of said resonating portion, and concavities in both major substrate surfaces, the inner wall of the annular portion defining each concavity in the one crystal orientation sloping at an angle less than that of the inner wall in the other crystal orientation perpendicular thereto, the method comprising the steps of: covering the both major surfaces of the flat-shaped piezoelectric substrate with masks for etching therethrough the substrates to form said concavities; and etching the piezoelectric substrate through said masks to form the concavities in those areas of the both major surfaces of the piezoelectric substrate which are exposed in the openings of the masks; characterized in that the position of each of said mask is shifted in said one crystal orientation to bring the marginal edges of the bottom surfaces of said concavities into alignment with each other.

The piezoelectric substrate manufacturing method recited in claim 26 is characterized in that said piezoelectric substrate in claim 25 is a piezoelectric substrate wafer having a plurality of piezoelectric substrates arranged in sheet form.

The piezoelectric resonating element manufacturing method recited in claim 27 is a method for the manufacture of a piezoelectric resonating element having a thin resonating portion formed by a concavity made in one of major surfaces of a piezoelectric substrate, which method comprises a first main etching step of forming the resonating portion by etching away a predetermined portion of the one major surface, a frequency measuring step of measuring the resonance frequency of said resonating portion, a first fine-adjustment etching step of making fine-adjustments to the thickness of said resonating portion based on the frequency measured by said frequency measuring step, and a second main etching steps of further reducing the thickness of said resonating portion, and a second fine-adjustment etching step of making fine-adjustments to the thickness of said resonating portion, the method being characterized in that said etching steps are both performed by wet etching.

The piezoelectric resonating element manufacturing method recited in claim 28 is characterized in that said second main etching step in claim 27 is to perform etching over the entire area of the other major surface of said piezoelectric wafer.

The piezoelectric resonating element manufacturing method recited in claim 29 is characterized in that said second main etching step in claim 27 is to perform etching over the entire area of either major surface of said piezoelectric wafer in claim 27.

The piezoelectric resonating element manufacturing method recited in claim 30 is characterized in that said second fine-adjustment etching step in any one of claims 27 to 29 is to perform etching over the entire area of the other major surface of said piezoelectric wafer.

The piezoelectric resonating element manufacturing method recited in claim 31 is characterized in that said second fine-adjustment etching step in any one of claims 27 to 29 is to perform etching over the entire area of either major surface of said piezoelectric wafer.

The piezoelectric resonating element manufacturing method recited in claim 32 is characterized in that the manufacturing method of any one of claims 27 to 31 includes a step of forming a plurality of concavities in one piezoelectric wafer and dividing the wafer into a plurality of piezoelectric resonating elements.

The piezoelectric resonating element manufacturing method recited in claim 33 is characterized in that said frequency measuring step in claim 32 is to conduct frequency measurements for all of the resonating portions and that said first fine-adjustment etching step is to perform etching for each of the resonating portions.

The piezoelectric resonating element manufacturing method recited in claim 34 is characterized in that said frequency measuring step in any one of claims 32 to 33 is to conduct frequency measurements for some of the plurality of resonating portions and that said second main etching step and said second fine-adjustment etching step are to perform etching simultaneously for all of the resonating portions.

BRIEF DESCRIPTION OF THE DRAWINGS

FIG. 3 is a diagram showing, by way of example, the crystal resonating element of the present invention as being applied to a surface-mount crystal oscillator.

FIGS. 4(a), (b) and (c) area perspective view of the crystal resonating element (crystal substrate) according to an embodiment of the present invention corresponding to the second prior art example, a sectional view showing the crystal resonating element mounted in a package, and a diagram explanatory of the wafer configuration.

FIG. 5 is a plan view showing the principal part configuration of a piezoelectric substrate wafer according to another embodiment of the present invention.

FIGS. 6(a) and (b) are a diagram showing the principal part configuration of a piezoelectric substrate wafer according to another embodiment, and a perspective view of a crystal resonating element blank.

FIG. 9(a) is a perspective view showing, by way of example, a crystal resonating element made of an AT-cut crystal as the piezoelectric resonating element according to the present invention, and (b) is a longitudinal-sectional view taken on the line A—A in FIG. 9(a).

FIG. 11(a) is a longitudinal-sectional view of the crystal resonator at the end of first fine-adjustment etching during etching process in the embodiment of the present invention, and (b) is a longitudinal-sectional view of the crystal resonator at the end of second fine-adjustment etching.

FIG. 13 is a table showing conditions for etching in the manufacturing method according to the present invention.

FIGS. 21(a) to (d) are longitudinal-sectional views of the crystal resonator in respective etching steps in the conventional manufacturing method.

DETAILED DESCRIPTION OF THE PREFERRED EMBODIMENT

Figure 1:
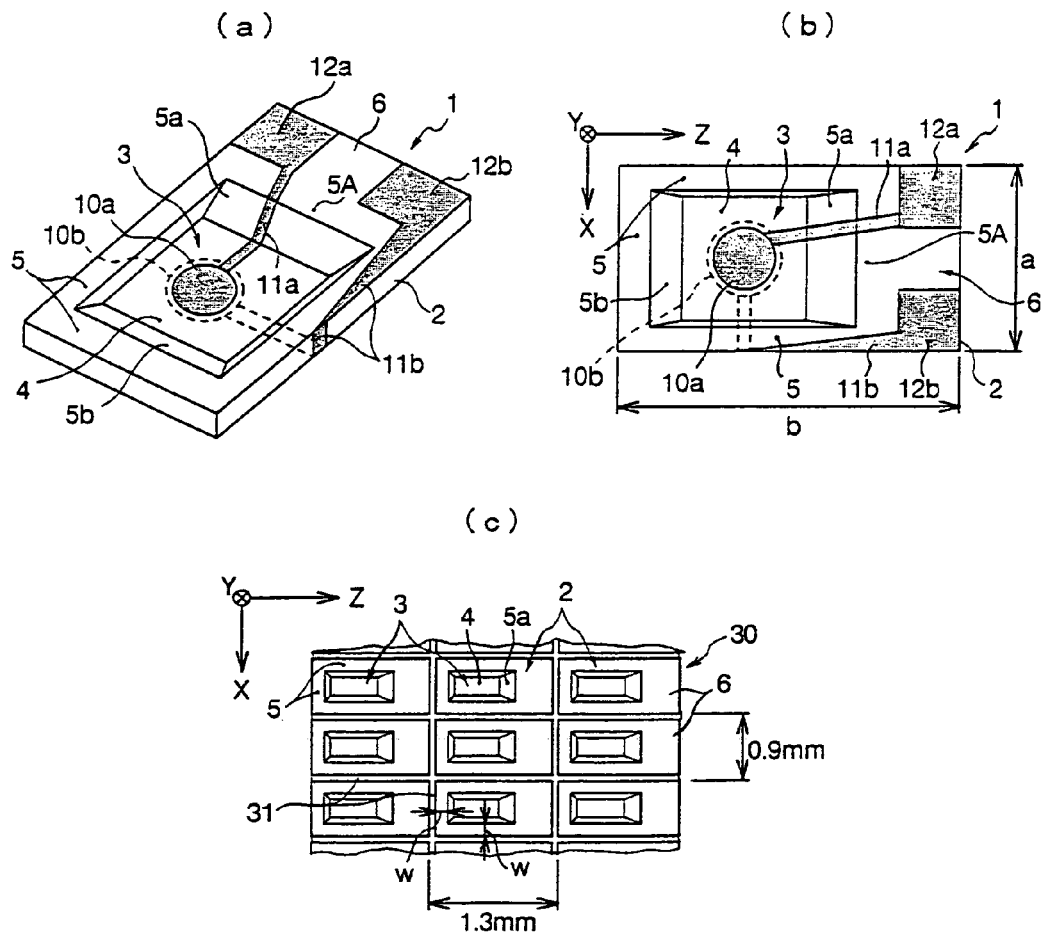
FIGS. 1(a), (b) and (c) are perspective and plan views showing a crystal resonating element made of an AT-cut crystal as an example of the piezoelectric resonating element according to an embodiment of the present invention, and a diagram showing the principal part of a wafer.

The present invention will hereinafter be described in detail with reference to its embodiments shown in the drawings.

[Embodiment Corresponding to First Prior Art Example]

FIGS. 1(a) and (b) are perspective view and plan views showing a crystal resonating element 1 made of an AT-cut crystal as an example of the piezoelectric resonating element according to an embodiment of the present invention.

The crystal resonating element 1 is provided with a crystal substrate 2 made of an AT-cut crystal as an anisotropic piezoelectric material, excitation electrodes formed on both major surfaces of the crystal substrate 2, respectively, lead electrodes 11a and 11b extending from the excitation electrodes 10a and 10b, respectively, and connecting pads 12a and 12b forming respective lead electrode end portions.

The crystal substrate 2 has a construction in which an ultrathin resonating portion 4 is formed by the bottom of a concavity 3 formed by etching in one of major surfaces of a rectangular flat-shaped substrate longer in the z-axis direction and the outer marginal edge of the resonating portion 4 is integrally held by a thick annular portion 5. One side 5A of the annular portion 5 lying in the z-axis direction is extended a predetermined length in the z-axis direction to form a flat-shaped jut-out portion 6. On one side of the jut-out portion 6 there are routed the lead electrodes 11a and 11b extending from the excitation electrodes and the connecting pads 12a and 12b are disposed at the ends of the lead electrodes 11a and 11b.

On characteristic point in which the crystal resonating element 1 according to this embodiment differs from the crystal resonating element of the prior art example is that the crystal substrate 2 takes a shape of a rectangle longer in the z-axis so that the annular portion 5 is sufficiently wide and mechanically strong. Accordingly, the gentlest slope 5a is located on the side of the jut-out portion 6. And the lead electrode 11a extended from the excitation electrode 10a disposed on the bottom of the concavity forming the resonating portion 4 can be routed along the gentlest slope 5a. Furthermore, when the crystal resonating element is supported in a cantilever fashion in a package, the supporting point and the resonating portion can be spaced as far apart as possible.

When the concavity 3 is formed in the major surface of the crystal substrate 2 by an etching operation using a required etchant, the substrate surface is covered with a mask through which to expose the surface area corresponding to the concavity 3; in this case, of the four inner walls of the concavity 3, the inner walls 5a and 5b in the z-axis direction form gentler slopes as unetched portions than the inner walls in the x-axis direction. This embodiment takes advantage of this phenomenon in etching to lay out the crystal substrate 2 so that the jut-out portion 6 is located in the z-axis direction of the concavity 3. Accordingly, when crystal substrates are arranged on a wafer 30 with dicing or dividing grooves 31 formed between them, they are long sideways as depicted in FIG. 1(c). In this instance, the area of each crystal substrate is the same as is the case with the conventional crystal substrate shown in FIG. 16.

Figure 16:
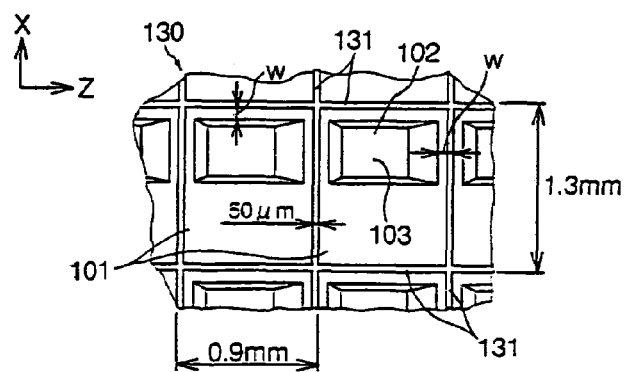
FIG. 16 is a diagram showing the principal part configuration of a piezoelectric substrate wafer used to form the piezoelectric substrate of FIG. 15.
Figure 17:
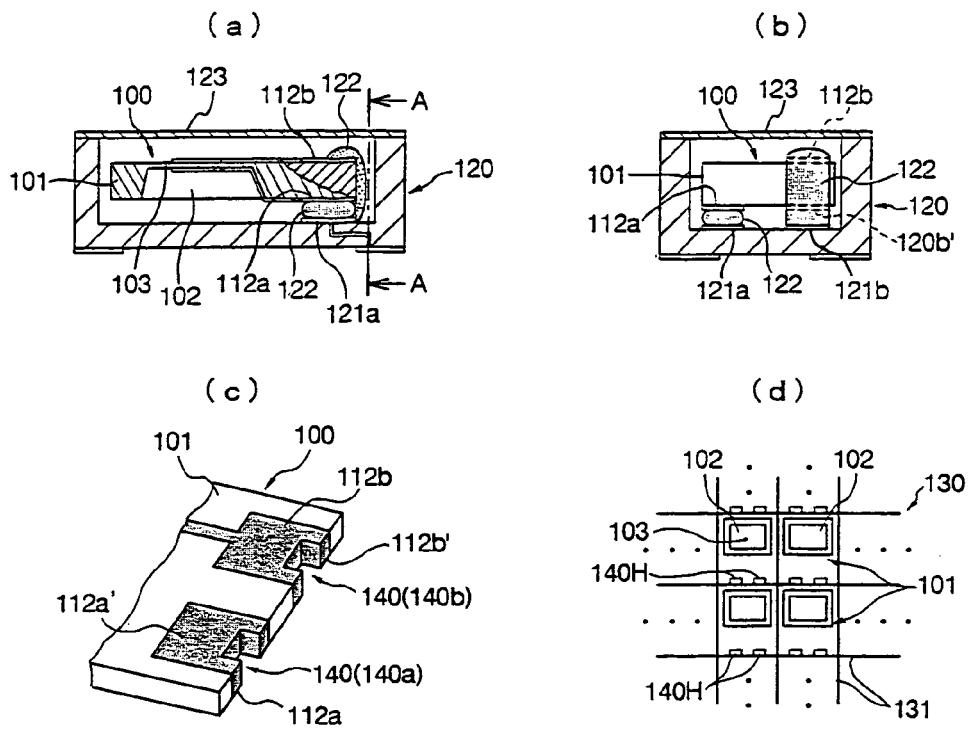
FIGS. 17(a) and (b) are a sectional view of a surface-mount crystal resonator according to another prior art example and a sectional view taken on the line A—A in FIG. 17(a), (c) is a perspective view showing concave notches made in a forward marginal edge of a jut-out portion, and (d) is a diagram showing the principal part configuration of the piezoelectric wafer used.
Figure 18:
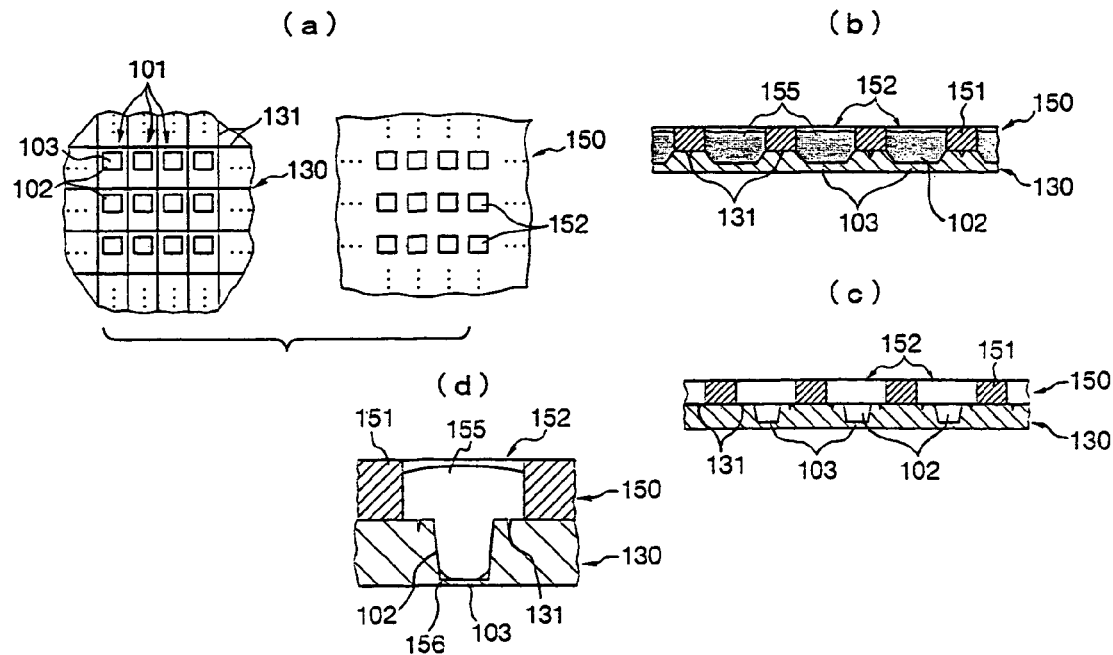
FIGS. 18(a), (b) and (c) are diagrams for explaining a conventional method for fine-adjustment for each concavity, and (d) is a diagram for explaining a defect of the conventional fine-adjustment method.
Figure 19:
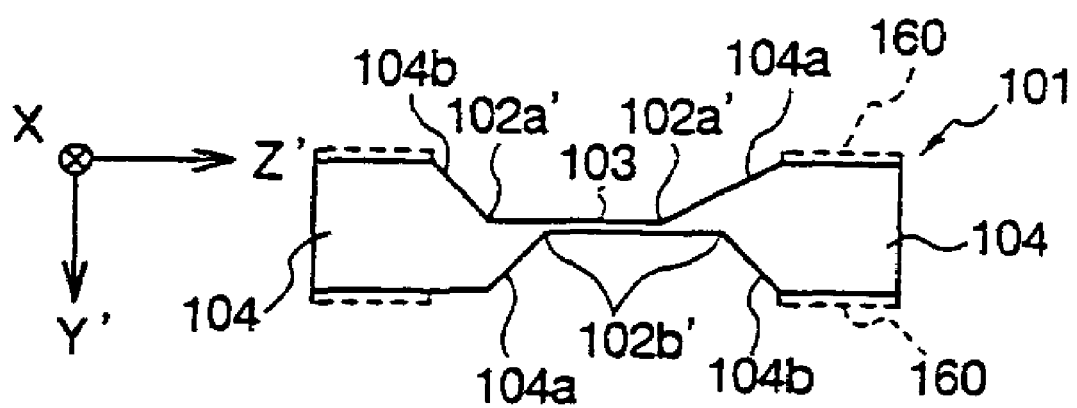
FIG. 19 is a sectional view of a conventional piezoelectric substrate having concavities in both surfaces thereof.
Figure 20:
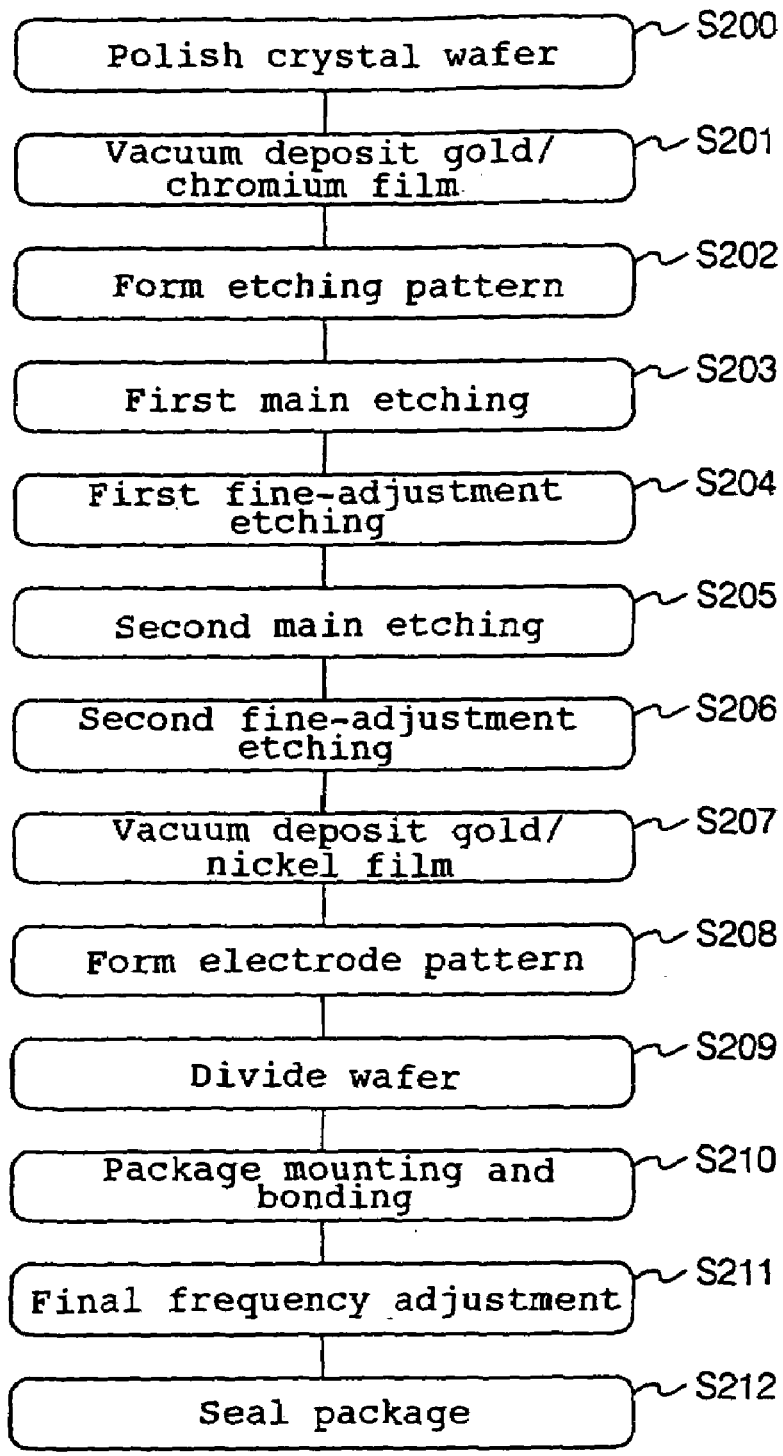
FIG. 20 is a diagram for explaining a conventional crystal resonator manufacturing process.
Figure 22:
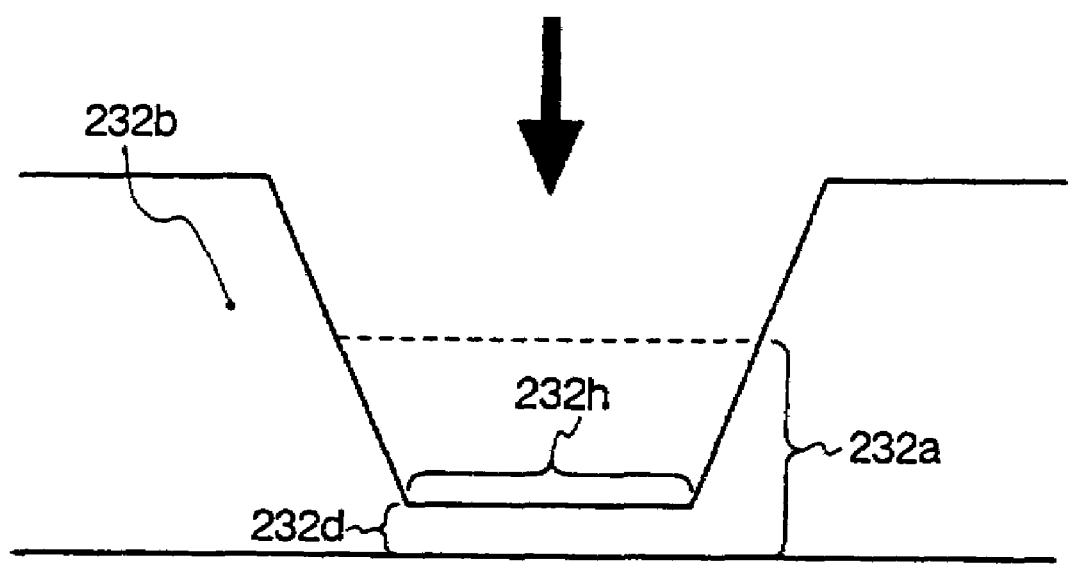
FIG. 22 is a longitudinal-sectional view showing a resonating portion formed by the conventional manufacturing method.

That is, according to the present invention, the area and shape of the crystal substrate itself are the same as in the FIG. 16 prior art example, but the lengthwise direction of the crystal substrate is the z-axis direction. Accordingly, the spacing w between the three marginal edges of the concavity 3 and the respective dividing grooves 31 can be made sufficiently large to provided increased thickness of the annular portion 5, and hence it is possible to prevent the occurrence of cracking when the wafer is cut along the cutting roves 31.

Further, too close spacings between the lead electrodes 11a and 11b and between the connecting pads 12a and 12b are likely to cause electrical interference and exert bad influence on characteristics of the crystal resonating element; accordingly, when the lead electrode 11a on the concavity side is formed along the gentle slope 5a, the lead electrode 11b from the flat surface side is extended to the side surface of the concavity along a route spaced as far apart from the lead electrode 11a as possible.

The connecting pad 12a connected to the lead electrode 11a on the concavity side is disposed at the one corner of the jut-out portion 6 in its widthwise direction (in the x-axis direction), whereas the lead electrode 11b routed from the flat surface side to the side surface of the concavity is disposed at the other corner to space the connecting pad 12b as far apart from the connecting pad 12a.

Figure 2:
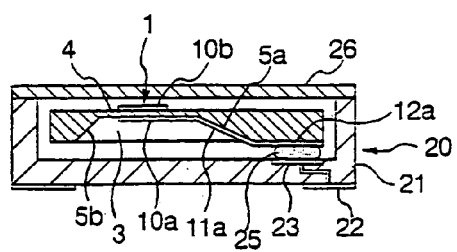
FIG. 2 is a sectional view of a crystal resonator with the crystal resonating element of FIG. 1 hermetically sealed in a package.

FIG. 2 is a sectional view showing the state in which the crystal resonating element 1 of FIG. 1 is mounted in a surface-mount package 20 and hermetically sealed therein. The package 20 is provided with a package body 21 having a open-topped cavity, and a metal cover 26 for closing the opening of the cavity of the package body 21. The package body 21 has an external electrode 22 formed on the underside of the body, and an internal electrode 23 formed on the bottom of the cavity and connected to the external electrode 22, and support the crystal resonating element 1 in a cantilever fashion by electrically and mechanically connecting the connecting pads 12 to the internal electrode 23 through a conductive adhesive 25.

In this case, the connecting portion (supporting portion) between the connecting pads 12 and the internal electrode 23 and the resonating portion 4 are interconnected through the gentlest slope 5a among the inner walls of the concavity 3. That is, the gentle slope 5a is utilized to space the connecting portion by the adhesive far apart from the resonating portion 4, and the cantilever structure relieves the stress on the resonating portion to prevent it from distortion.

FIG. 3 shows an example of application of the crystal resonating element 1 of the present invention to a surface-mount crystal oscillator; the crystal oscillator 40 has a construction in which, for example, the crystal resonating element 1 is supported in a cantilever fashion by fixing the connecting pad 12 on the internal electrode 23 formed on a stepped portion in the package body 21 by the conductive adhesive 25, circuit pats 41 forming an oscillation circuit and so on are mounted on pads formed on the bottom of the package body 21 and the cavity of the package body 21 is sealed with the metal cover 26.

Incidentally, while the above embodiment exemplifies the AT-cut crystal as an anisotropic piezoelectric crystal material, it is merely illustrative and the invention is applicable to every anisotropic piezoelectric crystal material (This goes for other embodiments). That is, the piezoelectric substrate configuration of the present invention is applicable to a piezoelectric substrate made of an anisotropic piezoelectric crystal material and having a thin resonating portion and a thick annular portion integrally surrounding the outer marginal edge of the resonating portion to thereby form a concavity in at least one of major substrate surfaces; in this instance, the outer dimensions of the piezoelectric substrate are set such that the length of the substrate in the direction in which the gentle slope of the smallest inclination angle among those of the inner walls of the concavity exists is longer than in the direction perpendicular to that in which the gentle slope exists.

With such a structure as described above, it is possible to implement formation of a thick annular portion, prevention of breaks in the lead electrodes, and prevention of the occurrence of distortion or stress in the resonating portion when it is mounted in a cantilever fashion in the package.

[Embodiment Corresponding to Second Prior Art Example]

FIGS. 4(a), (b) and (c) are a perspective view of a crystal resonating element (a crystal substrate) according to an embodiment of the present invention corresponding to the second prior art example, a sectional view of the resonating element mounted in a package, and a diagram explanatory of the wafer configuration. Incidentally, this embodiment shows an example of using the crystal substrate as a piezoelectric material, but it is intended as being merely illustrative and the present invention is applicable to any piezoelectric materials.

The crystal resonating element 1 is provided with a crystal substrate 2 made of an AT-cut crystal used as a piezoelectric crystal material, excitation electrodes 10a and 10b formed on both major surfaces of the crystal substrate 2, respectively, lead electrodes 11a and 11b extending from the excitation electrodes 10a and 10b, respectively, and connecting pads 12a, 12a' and 12b, 12b' forming end portions of the lead electrodes.

The crystal substrate 2 is a piezoelectric substrate of the configuration that has a thin resonating portion 4 and a thick annular portion 5 integrally surrounding the outer marginal edge of the resonating portion to form a concavity 3 in at least one of the major surfaces of the substrate, and it is provided with a jut-out portion 6 formed by extending one side 5A of the annular portion 5. The forward marginal edge 6a of the jut-out portion 6 has at least one pair of concave notches 7a and 7b open to the both surfaces of the crystal substrate 2. In this example, the concave notches 7a and 7b are provided at both end portions of the forward marginal edge 6a, that is, at both corners of the jut-out portion 6, and the inner walls of the concave notches 7a and 7b are coated with conductive films connected to the connecting pads 12a, 12a' and 12b, 12b'.

The connecting pad 12 connected to the lead electrode 11a extending from the excitation electrode 10a disposed on the concavity 3 side is connected to the connecting pad 12a' on the flat surface of the substrate via the conductive film coated on the inner wall of the concave notch 7a. On the other hand, the connecting pad 12b connected to the lead electrode 11b extending from the excitation electrode 10b disposed on the flat surface of the substrate is connected to the connecting pad 12b' on the concavity side via the conductive film coated on the inner wall of the concave notch 7b.

Incidentally, it is also possible to form only one concave notch, through which only one of the lead electrodes is routed to the opposite substrate surface for connection to a second connecting pad formed thereon.

In this embodiment, as described above, either of the lead electrodes 11a and 11b extending from the excitation electrodes 10a and 10b formed opposite on both sides of the resonating portion 4 of the piezoelectric substrate 2 to the forward marginal edge 6a of the jut-out portion 6 is routed to the opposite substrate surface via the conductive film coated on the inner wall of the concave notch and connected to the connecting pad on the said opposite substrate surface; hence, when the crystal resonating element 1 is mounted in the package 20 with the concavity held downward as shown in FIG. 4(b), the two connecting pads 12a and 12' position themselves on the jut-out portion 6 on the side of the concavity and can be connected to connecting pads 23a and 23b of the package side by giving a single coating of a conductive adhesive onto the connecting pads of the resonating element—such a structure precludes the possibility of the conductive adhesive protruding toward the flat surface of the substrate. This eliminates the need for increasing the height of the package 20 according to the amount of conductive adhesive protruding, and hence permits reduction in profile of the package.

Moreover, the provision of the pairs of connecting pads 12a, 12a' and 12b, 12b' on the both sides of the jut-out portion 6 allows a free choice of the orientation of the crystal resonating element 1 when it is mounted in the package.

Next, a description will be given, with reference to FIG. 4(c), of the procedure for mass-producing the piezoelectric substrate 2 or crystal resonating element 1 of the present invention by a batch operation using a large-area crystal substrate wafer (a piezoelectric substrate wafer) 30. (Incidentally, only one substrate in FIG. 4(c) is shown to have formed thereon a conductive pattern, for reference sake.) That is, in this embodiment, rectangular spaces defined by rows and columns of dividing grooves 31 formed in the wafer surface are used as individual crystal substrates, and the concavity 3 and through holes 7H forming the concave notches 7a and 7b are formed by chemical etching using a required etchant and a mask. A structural feature of this wafer lies in that the through hole 7H forming the concave notches is formed astride two laterally adjacent substrates so that the concave notches 7a and 7b are positioned at both corners of the forward marginal edge 6a of the jut-out portion 6.

Incidentally, the through hole 7H is obtained by joining together a pair of directly opposed small concave notches formed in both substrate surfaces by simultaneous etching as referred to previously in respect of the prior art. In this case, there is the possibility that the small concave notches cannot completely be interconnected if their diameters are too small.

As described above, in this embodiment the concave notches 7a and 7b are simultaneously formed in adjacent crystal substrates by making the through hole 7H astride them in the wafer 30. In this instance, the through hole 7H is formed by two neighboring concave notches, and hence it has a large size accordingly; thus, by simultaneous formation of the small concave notches by etching in the both substrate surfaces at the corresponding position, it is possible to sharply reduce the possibility that the both small concave notches are not completely joined together, resulting in a failure in the formation of the through hole.

Thereafter, the excitation electrodes 10a, 10b, the lead electrodes 11a, 11b, and the connecting pads 12a, 12a' and 12b, 12b' are respectively formed on both sides of each substrate by an arbitrary method such as vapor deposition or sputtering using a required mask, and at the same time the inside surfaces of the concave notches 7a and 7b are each coated with a conductive film.

After the formation of these conductor traces, characteristics of each crystal resonating element, such as its resonance frequency and so on, are measured with probe pins of measuring equipment held on the connecting pads 12a', 12b on the flat surface side, or on the connecting pads 12a and 12b' on the concavity side, then based on the measured results, a thickness adjustment operation is performed for each substrate, followed by severing the wafer along the dividing grooves 31.

By the way, after each crystal resonating element is formed by depositing the excitation electrodes and other conductor traces on each crystal substrate on the crystal substrate wafer 30, the characteristics of each crystal resonating element are measured using probe pins; in this case, if the substrates directly adjoin as depicted in FIG. 4(c), the connection of the probe pins to the two connecting pads 12a and 12b' on one crystal resonating element under measurement is made inside the right and left dividing grooves 31. But, since the distance between the position where to connect the probe pins to the connecting pads and the resonating portion 4 is as short as less than 0.5 mm, even the slightest pressure of the probe pins on the substrate surface through the connecting pads is likely to affect the resonance frequency of the resonating portion 4, constituting a factor making it difficult to achieve accurate measurement.

FIG. 5 is a plan view showing the principal part of a piezoelectric substrate wafer according to an embodiment configured to obviate such a problem.

A structural feature of this piezoelectric substrate wafer 30 lies in that the crystal resonating element 1 (the piezoelectric substrate 2) is flanked on either side by a dead space 50 as a region where no substrate is formed, with the resonating element and the dead space separated by the dividing line 31, and that there are formed on the dead space 50 dummy connecting pads 51 for connection with the connecting pads 12a, 12b' or 12a', 12b on the crystal resonating element. The dummy connecting pads 51 are connected to the connecting pads on the both surfaces of the adjoining substrates through the conductive films coated on the inside surfaces of the through holes 7H (concave notches 7a, 7b).

In the case of measuring the characteristics of each resonating element 1 on the piezoelectric substrate wafer of such a configuration as described above, probe pins of non-shown measurement equipment are not directly held in contact with the connecting pads 12a, 12b' or 12a', 12b, but instead they are contacted with the dummy connecting pads 51 disposed adjacent the connecting pads separated therefrom by the dividing grooves 31.

In this case, the transfer of stresses caused by contacting the probe pins with the dummy connecting pads 51 is interrupted by the dividing grooves 31—this lessens the influence of the stresses on the resonating portion 4 of the crystal resonating element 1, permitting accurate measurement.

Incidentally, while in the illustrated example each dead space 50 is shown to be of the same area as that of the adjoining piezoelectric substrate 2, this is illustrative only and the areas of the dead space 50 may be further decreased.

In the embodiments of FIGS. 4 and 5, since the through hole 7H is made astride adjacent substrate regions, or the substrate region and the adjoining dead space, two concave notches 7a and 7b are each formed at one end portion of the forward marginal edge 6a of the jut-out portion 6 of one piezoelectric substrate 2, but only one concave notch also suffices.

FIGS. 6(a) and (b) are a diagram showing the principal part of a piezoelectric wafer according to another embodiment of the present invention and a perspective view of a crystal resonating element. The piezoelectric substrate wafer 30 has elongated through holes 7H each made along the forward marginal edge 6a of the jut-out portion 6 of each piezoelectric substrate 2, and separate conductor films 7C are formed on the inner wall of the through hole 7H to establish electrical connections between the connecting pads 12a, 12a' and 12b, 12b' on both side of the substrate.

The excitation electrodes 10a, 10b, the lead electrodes 11a, 11b, the connecting pads 12a, 12a', 12b, 12b' and the separate conductor films 7C are formed, then frequency measurement is conducted for each substrate with probe pins held in contact with the connecting pads or dummy connecting pads 51 (see FIG. 5), and the wafer is severed along the dividing grooves 31 into individual crystal resonating elements such as shown in FIG. 6(b). In this case, severing along the dividing grooves 31 renders each through hole 7H into the concave notch 7. The separate conductor films 7C on the concave notch 7 are spaced apart from each other.

This embodiment needs only to make one through hole for each substrate, and hence it simplifies the configuration of the mask for etching, cutting manufacturing costs and increasing mass-productivity.

Incidentally, excitation electrodes are formed opposite on both sides of the resonating portion of the piezoelectric substrate configured as described above, and lead electrodes extending from the excitation electrodes to the forward marginal edge of the jut-out portion and connecting pads are formed, by which a piezoelectric resonating element is obtained.

Then, two connecting pads disposed side by side on the same side of the jut-out portion of the piezoelectric substrate forming the above-mentioned piezoelectric resonating element are bonded to pads in a surface-mount package by use of a conductive adhesive, by which a piezoelectric resonator is obtained.

And, circuit parts forming an oscillation circuit are incorporated into the package forming such a piezoelectric resonator, by which a surface-mount piezoelectric oscillator is obtained.

[Embodiment Corresponding to Third Prior Art Example]

Figure 7:
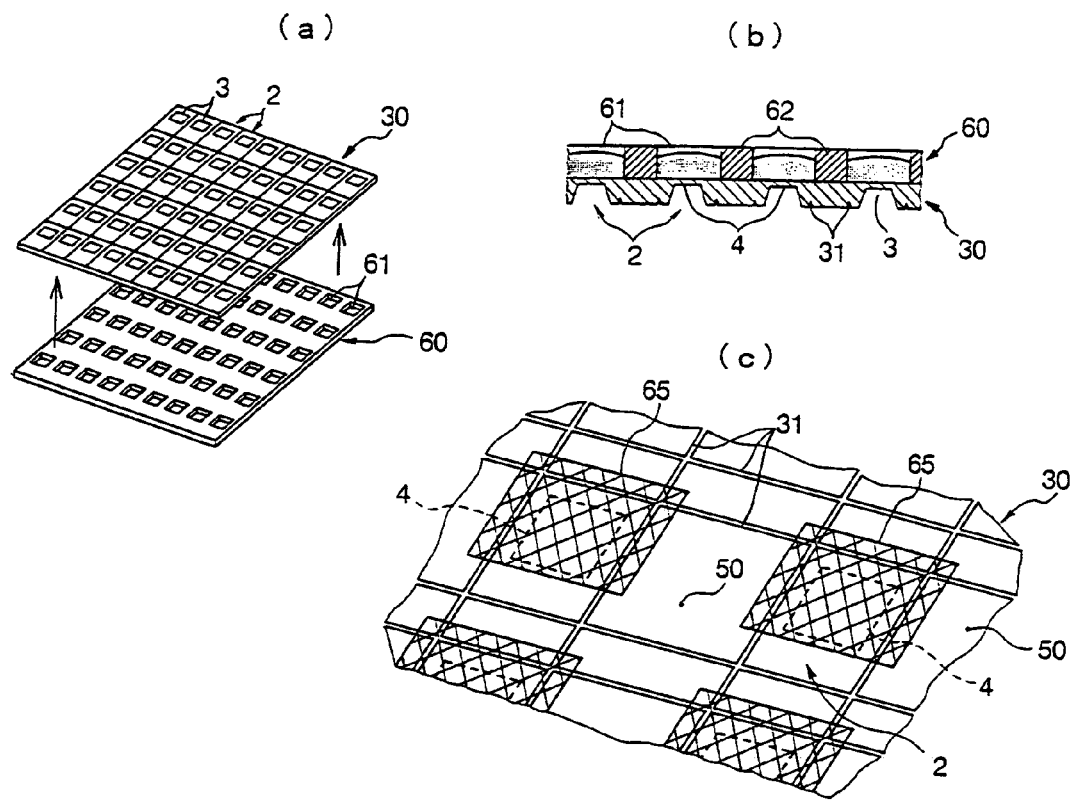
FIGS. 7(a) and (b) are explanatory diagrams of an embodiment corresponding to the third prior art example, and (c) is an explanatory diagram of a thickness fine-adjustment portion.

FIGS. 7(a) and (b) are diagrams explanatory of the embodiment corresponding to the third prior art example; in this embodiment, a guide mask 60 having apertures 61 (partitions 62) of preset size and pitch is mounted on the flat surface side of the piezoelectric substrate wafer 30, and then those flat surface regions of the vibrating portion 4 of the piezoelectric substrate wafer 30 exposed in the apertures 61 are individually etched.

That is, as referred to previously in respect of the prior art, due to technical limitations on machining, the minimization of the size and pitch of the apertures 61 of the guide mask 60 is limited. On this account, it is inevitable to use the guide mask 60 for individually adjusting the thickness of the resonating portion 4 in the concavity 3 smaller than the apertures 61 of the minimum size. However, the individual etching with the guide mask 60 mounted on the concavity side as in the past has too many demerits.

In view of the above, the present invention presets the spacing of the piezoelectric substrates 2 on the wafer 30 at a large value according to the size and pitch of the apertures 61 of the guide mask 60, and cuts two parallel dividing grooves 31 in the surface of the thick portions between the piezoelectric substrates 2. The thickness of the resonating portion 4 in each concavity 3 is premeasured, and the time for adjusting the resonating portions 4 of different thicknesses to a uniform thickness is precalculated.

And, the guide mask 60 is fixedly mounted on the flat surface side of the wafer 30 so that the resonating portions 4 are positioned at the centers of all the apertures 61 of the guide mask 60. Then, an etchant is filled into the concavities through the apertures 61 in a predetermined sequence. In this case, the etchant is filled into the concavities in descending order of thickness of the resonating portion 4, and at the time the thickness of every resonating portion has been reduced to a predetermined value, all the substrates are simultaneously cleaned out to remove the etchant.

As a result, a thickness fine-adjustment portion 65 of an area wider than that of the concavity is formed as a minute depression in the flat wafer surface exposed in the aperture 61 as shown in FIG. 7(c). Reference numeral 50 denotes a dummy region disposed between substrate regions.

As described above, in this embodiment, the guide mask is mounted on the flat surface side of the wafer, then an etchant is filed into concavities requiring fine-adjustment to the thickness of the resonating portion for different periods of time, and after etching, the substrates are cleaned to remove the etchant by one operation; hence, the concavity side of the wafer is not adversely affected by the etchant and the etchant does not permeate other regions through the dividing grooves 31 to cause glitches. Further, there is no possibility that the surface tension of the etchant filled in the concavity prevents its close contact with the inner wall of the concavity, causing insufficient etching and other glitches.

Incidentally, the thick portion defined by the two parallel dividing grooves 31 between the piezoelectric substrates is a dead space. By sufficiently widening the width of the dead space, it is possible to eliminate the possibility that the etchant filled into a certain aperture 61 exerting bad influence on adjoining piezoelectric substrate regions. By severing the wafer 30 along the dividing grooves 31 after making such thickness fine-adjustments for the resonating portion 4 in each concavity, it is possible to obtain individual piezoelectric substrates 2 each having a thickness fine-adjustment portion 65 for the resonating portion 4 on the substrate surface on the opposite side from the concavity 3.

Excitation electrodes are each formed on either of the resonating portion 4 of such a piezoelectric substrate 2 in directly opposed relation, and lead electrodes extending from the respective excitation electrodes to one marginal edge of the piezoelectric substrate lengthwise thereof and the connecting pads connected to the lead electrodes are formed as by vapor deposition, by which a piezoelectric resonating element is obtained.

Then, the piezoelectric substrate forming such a piezoelectric resonating element is supported at one end in a surface-mount package in a cantilever fashion and the package is hermetically sealed with a cover, by which a piezoelectric resonator is obtained.

And, circuit parts forming an oscillation circuit are integrally assembled in place with the package forming the piezoelectric resonator, by which a surface-mount piezoelectric oscillator is obtained.

[Embodiment Corresponding to Fourth Prior Art Example]

Figure 8:
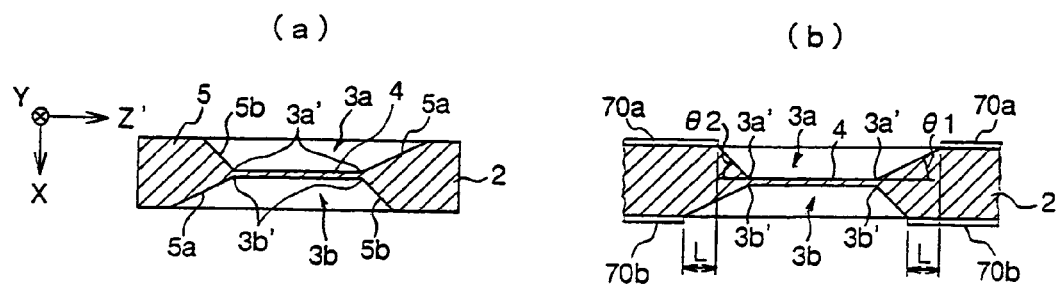
FIG. 8(a) is a sectional view of a piezoelectric substrate according to an embodiment corresponding to the fourth prior art example, and (b) is a sectional view of a piezoelectric resonator.

FIG. 8(*a*) is a sectional view of a piezoelectric substrate according to an embodiment of the present invention corresponding to the fourth prior art example.

The piezoelectric substrate of this embodiment is a piezoelectric substrate made of an AT-cut crystal that is an example of an anisotropic piezoelectric crystal material.

This crystal substrate 2 is provided with a thin resonating portion 4 and a thick annular portion 5 integrally surrounding the outer marginal edge of the resonating portion 4 to form concavities 3*a* and 3*b* in both major surfaces of the substrate. The inner walls 5*a* and 5*b* of each of the concavities 3*a* and 3*b* in the one crystal orientation (the z-axis direction) form gentler slopes than in the other crystal orientation (the x-axis direction) perpendicular thereto. And, edges 3*a*' and 3*b*' of the both bottoms of the concavities 3*a* and 3*b* are aligned with each other. This permits maximization of the effective area of the resonating portion 4.

In the case of forming the concavities 3*a* and 3*b* of such a crystal substrate 2 by chemical etching, the positions of those of the marginal edges of apertures 70*a*' and 70*b*' of masks (resist) 70*a* and 70*b* covering the both sides of the substrate which lie in the z-axis direction are predisplaced a predetermined distance L as depicted in FIG. 8(*b*). The predetermined distance L may be set such that the marginal edges 3*a*' and 3*b*' of the bottoms of the concavities 3*a* and 3*b* are brought into alignment with each other when etching is carried out.

Incidentally, excitation electrodes are each formed on either of the resonating portion 4 of such a piezoelectric substrate 2 in directly opposed relation, and lead electrodes extending from the respective excitation electrodes to one marginal edge of the piezoelectric substrate lengthwise thereof and the connecting pads connected to the lead electrodes are formed, by which a piezoelectric resonating element is obtained.

Then, the piezoelectric substrate 2 forming such a piezoelectric resonating element is supported at one end in a surface-mount package in a cantilever fashion and the package is hermetically sealed with a cover, by which a piezoelectric resonator is obtained.

And, circuit parts forming an oscillation circuit are incorporated into the package forming the piezoelectric resonator, by which a surface-mount piezoelectric oscillator is obtained.

The manufacture of such a piezoelectric substrate as depicted in FIG. 8 involves a step of forming the masks 70*a* and 70*b* through which to perform etching on both major surfaces of the flat-shaped piezoelectric substrate 2 to form therein concavities 3*a* and 3*b*, and a step of performing etching on the piezoelectric substrate covered with the masks to form the concavities 3*a* and 3*b* in those regions of the both major surfaces exposed through the apertures of the masks; in the mask forming step the positions of the masks 70*a* and 70*b* are displaced in one crystal orientation (the z-axis direction) to bring the marginal edges 3*a*' and 3*b*' of the bottoms of the concavities into alignment with each other.

By the way, the above piezoelectric substrate 2 may be severed from a piezoelectric substrate wafer having a plurality of piezoelectric substrates arranged in sheet form, in which case mass production by batch process can be achieved.

[Embodiment Corresponding to Fifth Prior Art Example]

Next, a description will be given of a manufacturing method according to an embodiment of the present invention which corresponds to the fifth prior art example.

FIG. 9(*a*) is a perspective view of an AT-cut crystal resonator obtained with the manufacturing method according to the present invention, and FIG. 9(*b*) is a sectional view taken on the line A—A in FIG. 9(*a*).

As shown, the crystal resonator 1 is a resonator that utilizes thickness-shear resonance of the AT-cut crystal resonator; the crystal resonator 1 has in its one major surface a concavity formed by chemical etching, a resonating portion 4 formed by an ultrathin portion of the concavity, and a thick annular portion 5 integrally formed with the outer marginal edge of the resonating portion 4 to support it.

Furthermore, on the other flat major surface of the crystal resonator 1 there are formed, by evaporation using a mask or photolithography, a main electrode 10*a*, a lead 11*a* extending from the main electrode 10*a* and a bonding pad 12*a*, and the one major surface is vapor-deposited over the entire area thereof with an electrode 15.

It is also possible to employ a configuration in which the full-face electrode 15 is not used but instead excitation electrodes are disposed on both sides of the resonating portion 4 of the crystal resonator 1 in opposed relation as is the case with the FIG. 1 embodiment and lead electrodes are extended from the excitation electrodes to respective connecting pads.

FIG. 11 shows longitudinal-sectional views of the crystal resonator during etching according to the present invention, FIG. 11(*a*) being a longitudinal-sectional view of the crystal resonator after being subjected to first fine-adjustment etching, and FIG. 11(b) being a longitudinal-sectional view of the crystal resonator after being subjected to second main etching to second fine-adjustment etching.

The difference between the manufacturing method according to the present invention and the conventional method in that is not the combined use of wet etching and dry etching, but resides in the manufacture of the crystal resonator 1 only by the wet etching process that achieves high working efficiency and permits reduction in the costs for equipment. The inventor of this application conducted various experiments and found the phenomena described below and confirmed the feasibility of manufacturing the crystal resonator 1 of satisfactory quality by wet etching alone.

As shown in FIG. 11(a), let a thickness error between resonating portions 92a and 93a individually adjusted by the first fine-adjustment etching so that the frequency of fundamental vibration determined by the thickness of the resonating portion 4 is in the VHF band, that is, adjustment accuracy, be represented by $\Delta 1$.

On the other hand, When the crystal resonator in the state shown in FIG. 11(a) is subjected to batch adjustment by the second main to second fine-adjustment etching so that the frequency of fundamental vibration dependent on the thickness of the resonating portion 4 is in the UHF band, the thickness error between resonating portions 92b and 93b becomes adjustment accuracy $\Delta 2$ as shown in FIG. 11(b). And the inventor of this application noticed that the adjustment accuracy $\Delta 1$ and the adjustment accuracy $\Delta 2$ are nearly equal. That is, if the adjustment accuracy $\Delta 1$ is kept within a desired range by the first fine-adjustment etching, the resonating portions need not be individually adjusted by the second fine-adjustment etching, and all the resonating portions need only to be collectively etched based on frequencies premeasured for some of the resonating portions 4 on the wafer.

Figure 10:
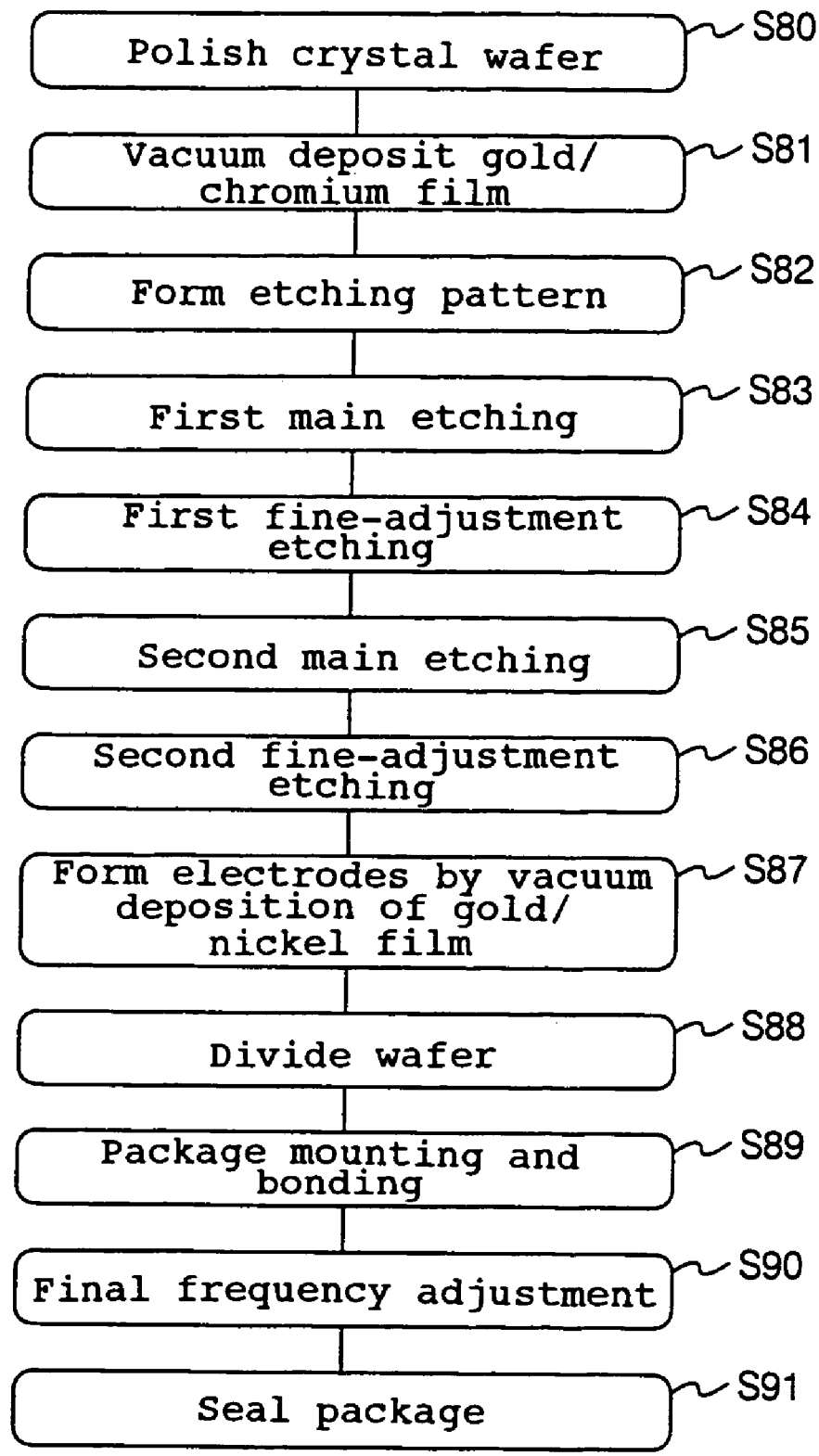
FIG. 10 is a diagram for explaining a sequence of steps involved in the manufacture of the crystal resonator according to an embodiment of the present invention.

FIG. 10 is a diagram showing a crystal resonator manufacturing process according to the present invention. FIG. 13 is a table showing conditions for etching in the manufacturing process.

Figure 12:
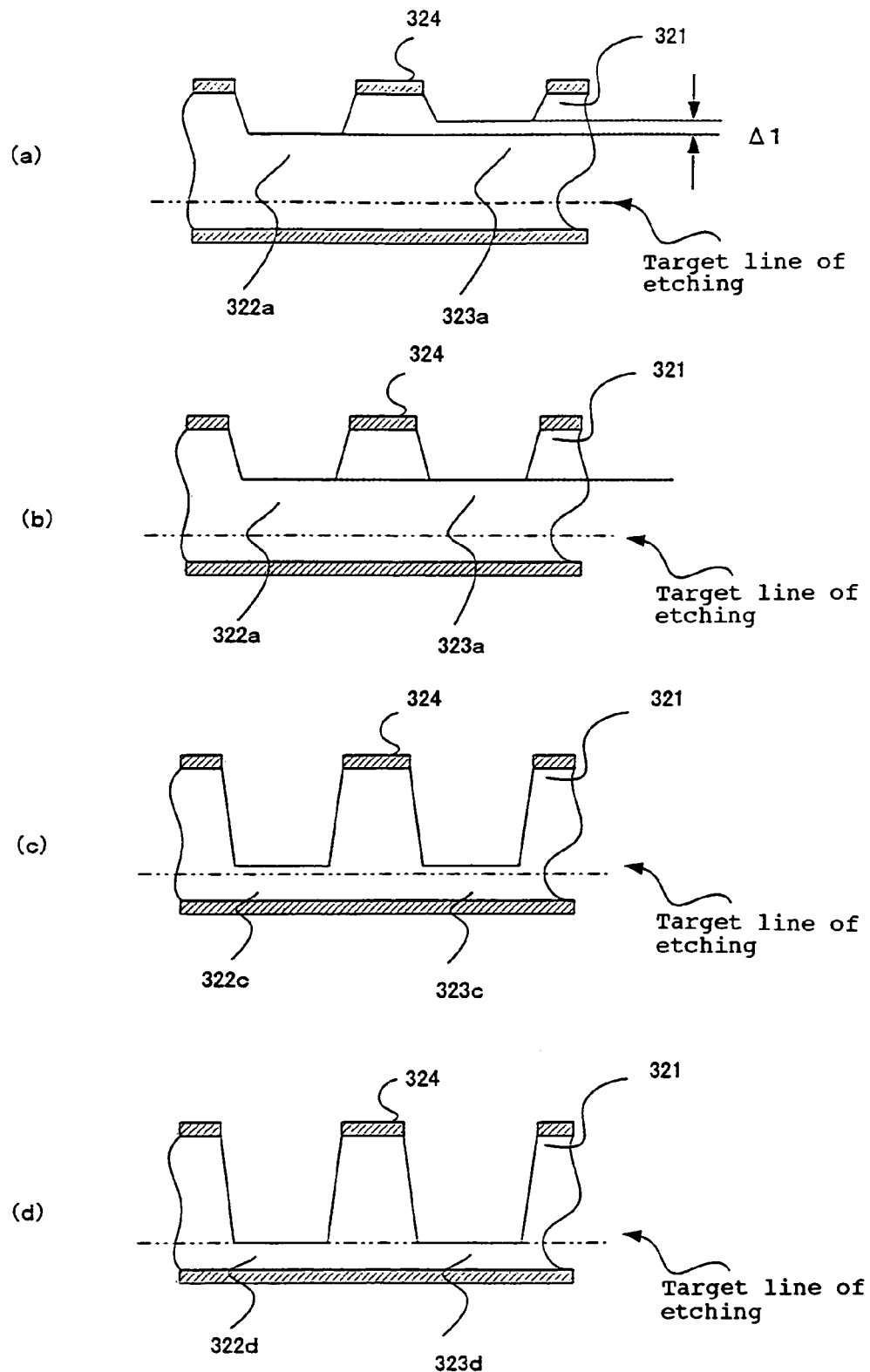
FIGS. 12(a) to (d) are longitudinal-sectional views showing a sequence of steps of etching in the piezoelectric resonator manufacturing method according to the present invention.

In the first place, the major surface of a crystal wafer is polished (step 80), and a gold/chromium film is vacuum-deposited over the entire area of the polished major surface of the wafer (step 81). In this case, a crystal wafer of 80 micrometers (µm) thick is used in view of a trade-off between the mechanical strength of the wafer and the amount of etching. Thereafter, the gold/chromium film is selectively removed by lithography to form a mask patter for etching (step 82), and in the first main etching (first main etching: step 83) a crystal wafer 321 having formed thereon a mask pattern 224 for etching is subjected to wet etching to etch away the wafer surface portions exposed through apertures of the mask pattern, by which resonating portions 322a and 323a having a resonance frequency in the VHF band, for instance, 155 MHz, are formed as shown in FIG. 12(a). The first main etching is conducted using a hydrogen fluoride ammonium saturated solution at 85° C., the etching rate is 25 nm/sec, and the adjustment accuracy is ±612 nm/sec. In practice, since there is a variation $\Delta 1$ in the thickness of the resonating portions 222a and 223a due to a wafer working error or the like, the resonance frequencies of the resonating portions 222a and 223a are measured. In the first fine-adjustment etching (first fine-adjustment etching: step 84), as shown in FIG. 21(b), the resonating portions 322a and 323a are individually adjusted by wet etching based on the measured frequencies so that they have desired frequencies. In this case, the adjustment is made to remove the thickness variation $\Delta 1$ between the resonating portions. As shown in FIG. 13, the first fine-adjustment etching is carried out using a 23% or 12% dilute solution of hydrofluoric acid at room temperature (21° C. or so), the etching rate is 1.5 nm/sec or 0.75 nm/sec. Either etchant gives an adjustment accuracy of ±93 nm/sec. Which of the etchants is used for the first fine-adjustment etching depends on the adjustment accuracy of the first main etching (step 83); the thickness of each resonating portion is adjusted a value substantially within a predetermined range by using the 12% dilute solution of hydrofluoric acid of low etching rate when the adjustment accuracy is high (for example, when the variation $\Delta 1$ is ±300 nm or below), and the 23% dilute solution of hydrofluoric acid of high etching rate when the adjustment accuracy is not s high.

After the fist fine-adjustment etching (step 84) the resonance frequency of each resonating portion is measured, and based on the measured results, the etching times for the second main etching (step 85) and the second fine-adjustment etching (step 86) are calculated.

For example, in the second main etching (step 85) the wafer is subjected in its entirety to wet etching to form resonating portions 322c and 323c having a thickness of approximately 2.2 µm that corresponds to a desired resonance frequency in the UHF band, for instance, 760.9 MHz as shown in FIG. 12(c); in the second fine-adjustment etching (step 86) the resonating portions 322c and 323c are simultaneously subjected to wet etching to form resonating portions 322d and 323d having the desired frequency as shown in FIG. 12(d).

Following this, electrodes are formed by gold/nickel vacuum deposition on either main surface of the wafer (step 87), then the wafer is severed into a plurality of crystal resonators 1 (step 88), then each crystal resonator 1 is mounted in a package and the connecting pads 12 are connected to the package by bonding or bumps (step 89), then the final frequency adjustment is made (step 90, and the package is sealed to form a piezoelectric resonator or piezoelectric oscillator (step 91).

The etching conditions for the second main etching and the second fine-adjustment etching are the same as those for the first main etching and the first fine-adjustment, respectively; particulars of the conditions are shown in FIG. 13. The adjustment accuracy in the second main etching and in the second fine-adjustment etching is ±110 nm/sec, but a variation in the final adjustment accuracy (±110 nm) by the etching process can be compensated for by an adjustment to the amount of deposition of the conductor films for the main electrode film 10a and the full-face electrode 15 in the gold/nickel deposition step (step 87) after etching and by high-accuracy frequency adjustment in the subsequent final frequency adjustment step (step 90) by vapor deposition or sputtering; in actual fact, a crystal resonator having a desired oscillation frequency is becoming a reality.

That is, in the piezoelectric resonator manufacturing method according to the present invention, the first main etching and the first fine-adjustment etching makes adjustment so that the adjustment accuracy $\Delta$ comes within the desired range, and the second main etching and the second fine-adjustment etching perform collective etching; this avoids the need for making a thickness adjustment for each resonating portion in the second fine-adjustment etching, hence permits simplification of the manufacturing process.

Figure 14:
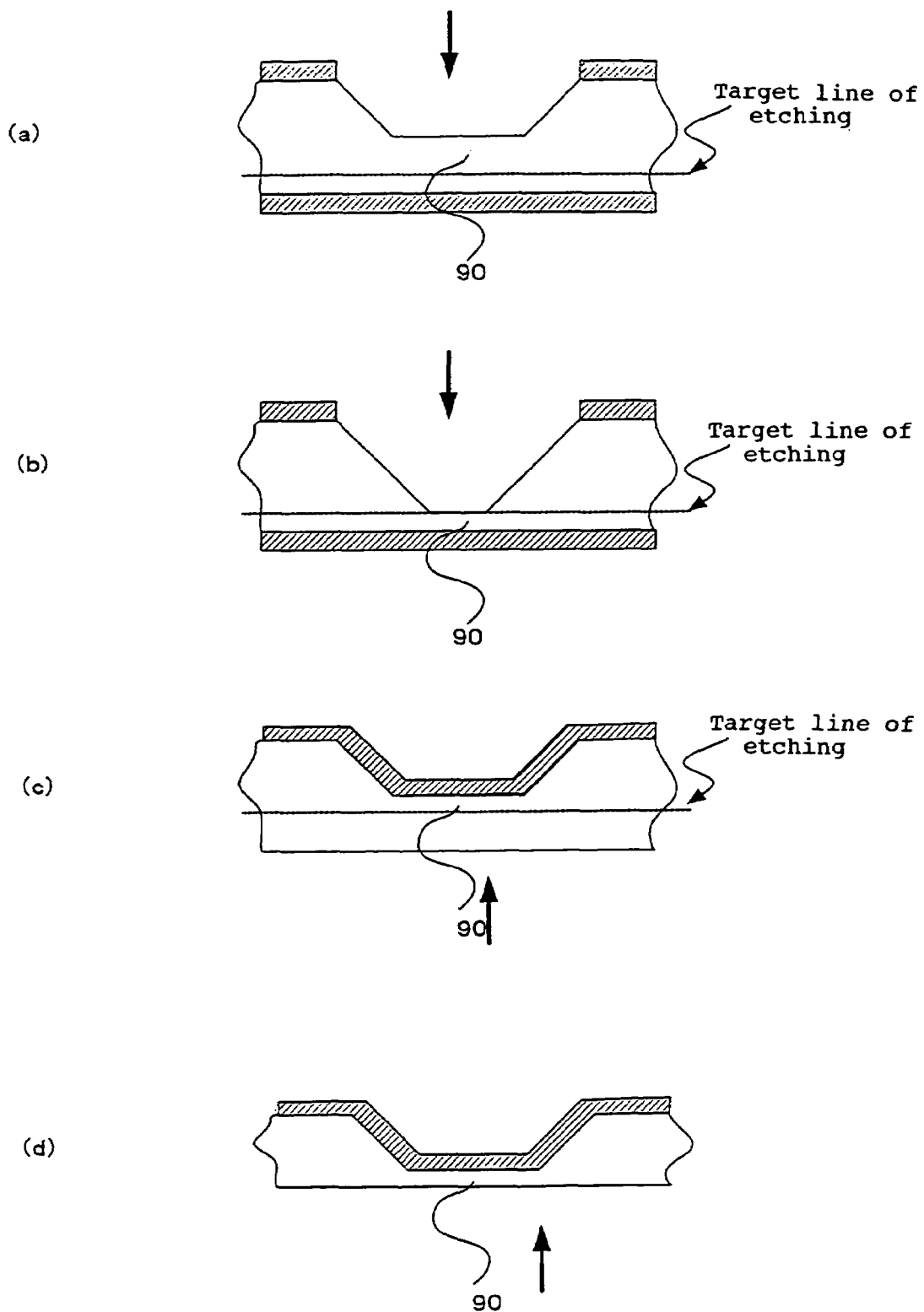
FIGS. 14(a) to (d) are diagrams for explaining the direction of etching in the embodiment of the present invention.
Figure 15:
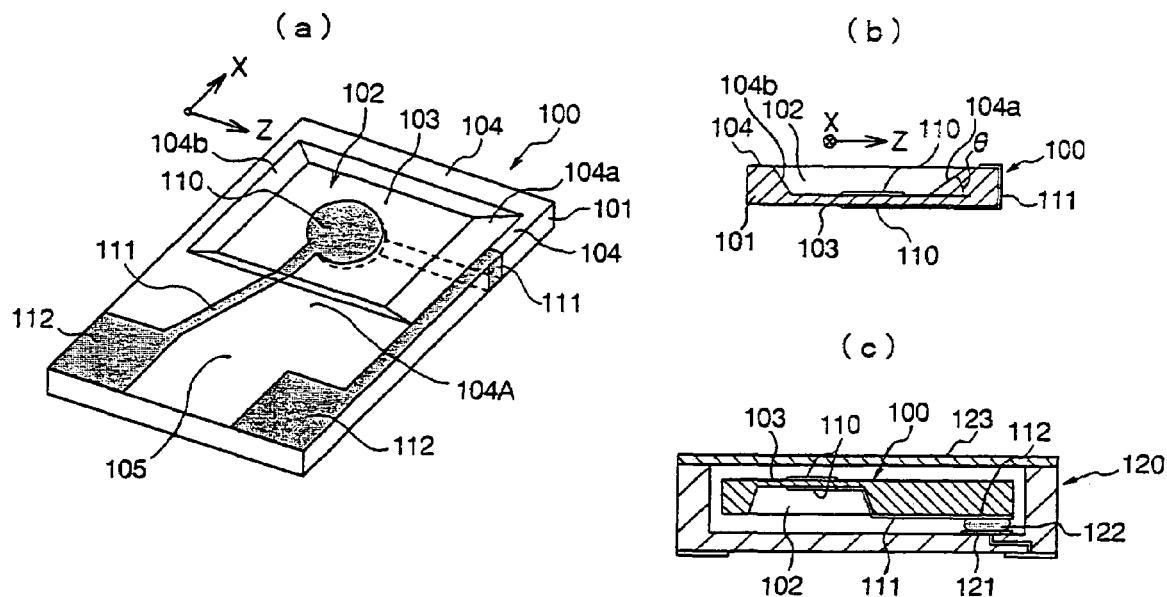
FIGS. 15(a) and (b) perspective and sectional views showing the configuration of an AT-cut crystal resonating element as an example of a conventional piezoelectric resonating element, and (c) is a sectional view showing the crystal resonating element mounted in a surface-mount package.

FIG. 14 shows the direction of etching in the manufacturing method of the present invention; (a) is a diagram showing the shape of the crystal resonator after being subjected to the first main etching and the first fine-adjustment etching, and (b) is a diagram showing the shape of the crystal resonator after being subjected to the second main etching and the second fine-adjustment etching.

As is evident from FIGS. 14(a) and (b), in the case of etching from the direction indicated by the arrow, the area of the resonating portion 90 in the horizontal direction is extremely narrow due to the anisotropy of crystal (crystal). To avoid this, after the first main etching and the second fine-adjustment etching the major surface of the wafer subjected to etching is masked as shown in FIG. 14(c), and the wafer is subjected in its entirety to the second main etching and the second fine-adjustment etching from the direction indicated by the arrow (from the direction of the other major surface), by which it is possible to obtain a resonator in which the area of the resonating portion 90 inside the concavity is wider than in the past as shown in FIG. 14(d). By changing the direction of etching for the first main etching and the first fine-adjustment etching and for the second main etching and the second fine-adjustment etching as mentioned above, masking of the other major wafer surface (the underside in the drawing) is dispensed with.

The decision as to which of major surfaces is to be masked can be made based on the result of the first-fine-adjustment etching (step 84) for individual adjustment.

While the present invention has been described as being applied to the crystal resonator, the invention is also applicable to MCF (Monolithic Crystal Filter) provided with an ultrathin resonating portion.

Besides, although the construction of the present invention has been described using crystal, the invention is not limited specifically to crystal, and it is needless to say that the invention is applicable to langasite, lithium tetraborate, lithium tantalite, lithium niobate and similar piezoelectric materials.

Furthermore, the manufacturing method of the present invention has been described to use the four-stage chemical etching process, but it is also possible to employ chemical etching process of four or more stages including two-stage fine-adjustment etching process with a view to reducing the manufacture cycle time.

Moreover, The manufacturing method of the present invention has been described as being applied to the crystal wafer, but the invention is also applicable to a single blank.

Thus, it is possible to obtain a high-efficiency, low-cost piezoelectric manufacturing method, in particular, an UHF-band, AT-cut crystal resonator manufacturing method.

As described above, according to the inventions corresponding to claims 1 to 5, in the case where an ultraminiature piezoelectric substrate, which has a resonating portion made by forming a concavity by etching in the surface of a piezoelectric substrate made of an anisotropic piezoelectric crystal material, is mass-produced by batch operating using a large-area piezoelectric substrate wafer, the annular marginal portion surrounding the concavity can be formed thick enough to prevent cracking when the wafer is severed. Further, a conductive trace is routed along a gentle slope formed on the inner wall of the annular portion, by which a break in the trace can be avoided. Besides, in the case of supporting the piezoelectric resonating element in a cantilever fashion in a package, the application of stress by the weight of the crystal resonating element to the resonating portion can be prevented by spacing the cantilever supporting portion and the resonating portion as far apart as possible. Thus, the first object of the invention is to implement the optimum configuration of an ultraminiaturized piezoelectric substrate having an ultrathin resonating portion and a thick annular marginal portion surrounding it.

According to the second inventions corresponding to claims 6 to 12, in the case where a through hole (concave notches) for electrical connection between two connecting pads on both sides of each substrate is formed by chemical etching in a piezoelectric substrate wafer, insufficient formation of the through hole by limitations on upsizing of its opening and the resulting decrease in productivity can be prevented.

According to the third inventions corresponding to claims 13 to 19, in order to obviate various glitches caused when the thickness adjustment of the resonating portion for each concavity is made by etching for a different period of time after the formation of the concavities in a piezoelectric substrate wafer by one operation, fine-adjustment of the thickness of each resonating portion can be made by etching on the flat surface side of the wafer instead of making thickness adjustment by filling with each concavity with an etchant.

According to the inventions corresponding to claims 20 to 26, in a piezoelectric substrate of an anisotropic piezoelectric material which has a thin resonating portion is formed by concavities made by chemical etching in both major surfaces of the substrate, it is possible to prevent the effective vibrating area from becoming small due to the fact that the positions of the both concavities disposed opposite across the resonating portion are displaced in the one crystal orientation relative to each other.

According to the invention recited to claim 27, it is possible to obtain a piezoelectric element manufacturing method which is simple in manufacturing process and low-cost in equipment, and the piezoelectric element produced by this method is a high-quality element that has no chemical reaction layer on its surface but is not etched more than required, and the manufacturing method allows ease in control for constant etching rate and achieves high production efficiency by continuous etching.

According to the inventions recited in claims 28 to 34, it is possible to obtain a manufacturing method that suppresses reduction in the area of the resonating portion which is caused by the dependence of etching rate on the crystal orientation.

What is claimed is:

1. A piezoelectric substrate made of an anisotropic piezoelectric crystal material and comprising a thin resonating portion, and a thick annular portion integrally surrounding the outer marginal edge of said resonating portion to form concavities in both major surfaces of said piezoelectric substrate, characterized in that:
   the inner wall of said annular portion defining each of said concavities gently slopes in the one crystal orientation more than in the other crystal orientation perpendicular thereto; and
   the positions of those of marginal edges of the bottoms of said concavities lying in said one crystal orientation are aligned with each other.

2. The piezoelectric substrate of claim 1, characterized in that it is made of an AT-cut crystal material.

3. A piezoelectric resonating element, characterized by the provision of excitation electrodes formed on both sides of said resonating portion in the piezoelectric substrate of claim 1 or 2 in opposed relation, lead electrodes extending from the excitation electrodes to one marginal edge of the piezoelectric substrate lengthwise thereof, and connecting pads connected to the lead electrodes, respectively.

4. A piezoelectric resonator, characterized in that the piezoelectric substrate forming the piezoelectric resonating element of claim 3 is supported at one end lengthwise thereof in a cantilever fashion in a surface-mount package.

5. A surface-mount piezoelectric oscillator, characterized by the provision of the piezoelectric resonator of claim 4, and an oscillation circuit.

* * * * *